United States Patent
Khor

(10) Patent No.: US 9,432,025 B1
(45) Date of Patent: Aug. 30, 2016

(54) TECHNIQUES FOR REDUCING SKEW BETWEEN CLOCK SIGNALS

(71) Applicant: Altera Corporation, San Jose, CA (US)

(72) Inventor: Chuan Thim Khor, Teluk Intan (MY)

(73) Assignee: Altera Corporation, San Jose, CA (US)

( * ) Notice: Subject to any disclaimer, the term of this patent is extended or adjusted under 35 U.S.C. 154(b) by 2 days.

(21) Appl. No.: 14/555,887

(22) Filed: Nov. 28, 2014

(51) Int. Cl.
| H03L 7/06 | (2006.01) |
| H03L 1/00 | (2006.01) |
| H03L 7/091 | (2006.01) |
| H03L 7/095 | (2006.01) |

(52) U.S. Cl.
CPC ............. *H03L 1/00* (2013.01); *H03L 7/091* (2013.01); *H03L 7/095* (2013.01); *H03L 2207/04* (2013.01)

(58) Field of Classification Search
None
See application file for complete search history.

(56) References Cited

U.S. PATENT DOCUMENTS

| 6,127,865 | A | 10/2000 | Jefferson |
| 6,686,785 | B2 | 2/2004 | Liu et al. |
| 6,687,320 | B1 | 2/2004 | Chiu et al. |
| 6,812,753 | B2 | 11/2004 | Lin |
| 6,943,610 | B2 | 9/2005 | Saint-Laurent |
| 7,619,451 | B1 | 11/2009 | Hoang et al. |
| 7,634,039 | B2 | 12/2009 | Maneatis et al. |
| 7,884,751 | B2 | 2/2011 | Shimizu et al. |
| 8,154,328 | B1 | 4/2012 | Vemula |
| 8,502,577 | B2 * | 8/2013 | Ok .................. 327/158 |
| 2003/0030473 | A1 * | 2/2003 | Lee ................. 327/158 |
| 2004/0113667 | A1 * | 6/2004 | Jin ................... 327/158 |
| 2007/0297552 | A1 * | 12/2007 | Bae et al. ........... 375/371 |
| 2009/0195277 | A1 * | 8/2009 | Yamakido et al. .... 327/158 |
| 2010/0283653 | A1 | 11/2010 | Dai et al. |
| 2012/0242382 | A1 * | 9/2012 | Tsuchiya et al. ..... 327/153 |
| 2013/0121094 | A1 * | 5/2013 | Zerbe et al. ......... 365/194 |

* cited by examiner

*Primary Examiner* — Cassandra Cox
(74) *Attorney, Agent, or Firm* — Steven J. Cahill

(57) ABSTRACT

A clock signal generation circuit generates a first clock signal based on second and third clock signals. The clock signal generation circuit generates an indication of a phase difference between the second and the third clock signals. A skew reduction circuit reduces skew between the second and the third clock signals in response to the indication of the phase difference between the second and the third clock signals indicating that the second and the third clock signals are aligned in phase within at least an error margin of the clock signal generation circuit.

20 Claims, 10 Drawing Sheets

TECHNIQUES FOR REDUCING SKEW BETWEEN CLOCK SIGNALS

FIELD OF THE DISCLOSURE

The present disclosure relates to electronic circuits, and more particularly, to techniques for reducing skew between clock signals.

BACKGROUND

A phase-locked loop (PLL) is an electronic circuit that adjusts the frequency of a feedback clock signal based on the frequency of a reference clock signal. Phase-locked loops (PLLs) provide periodic signals for data recovery, data transfer, and other clocking functions in integrated circuits. PLLs often supply a clock signal generated by an oscillator to one or more dividers that divide the clock signal to a lower frequency clock signal for distribution around an integrated circuit or system.

When a PLL is in lock, the phase of the reference clock signal is ideally aligned with the phase of the feedback clock signal. However, a PLL may generate skew between the reference clock signal and the feedback clock signal even when the PLL is in lock. Delay circuits can be added in the paths of the reference and feedback clock signals. The delays of the delay circuits in each integrated circuit are selected based on multiple samples of the integrated circuits.

BRIEF SUMMARY

According to some embodiments, a clock signal generation circuit generates a first clock signal based on second and third clock signals. The clock signal generation circuit generates an indication of a phase difference between the second and the third clock signals. A skew reduction circuit reduces skew between the second and the third clock signals in response to the indication of the phase difference between the second and the third clock signals indicating that the second and the third clock signals are aligned in phase within at least an error margin of the clock signal generation circuit.

Various objects, features, and advantages of the present invention will become apparent upon consideration of the following detailed description and the accompanying drawings.

DETAILED DESCRIPTION

Skew is the variation in arrival time of two signals that were expected to arrive at the same time. Delay circuits can be added in the paths of the reference and feedback clock signals in a phase-locked loop (PLL) circuit to reduce skew between the reference and feedback clock signals. However, variations in process, supply voltage, temperature, and loading (PVTL) between multiple integrated circuits may cause significant differences between the delays of corresponding delay circuits in different integrated circuits. If the delays of the delay circuits are selected to compensate for the average skew measured in multiple samples of the integrated circuits, the delay circuits may not provide sufficient skew compensation in some of the integrated circuits because of PVTL variations. In some instances, the delay circuits in some of the integrated circuits may not provide enough skew compensation to avoid timing failures.

In many circuit systems, clock signal frequencies have increased, and as a result, the tolerance toward the amount of skew between clock signals has decreased. The reduction in the tolerance toward skew between clock signals and the prevalence of PVTL variations within a single integrated circuit and between multiple integrated circuits have created a need for improved techniques for reducing skew.

According to some embodiments described herein, a skew reduction circuit includes first and second adjustable delay circuits. The first adjustable delay circuit delays a first periodic signal to generate a second periodic signal. The second adjustable delay circuit delays a third periodic signal to generate a fourth periodic signal. The skew reduction circuit determines a delay setting based on a skew between the second and fourth periodic signals. The skew reduction circuit adjusts the delay of at least one of the first and the second adjustable delay circuits based on the delay setting to reduce skew between the second and fourth periodic signals.

Figure 1:
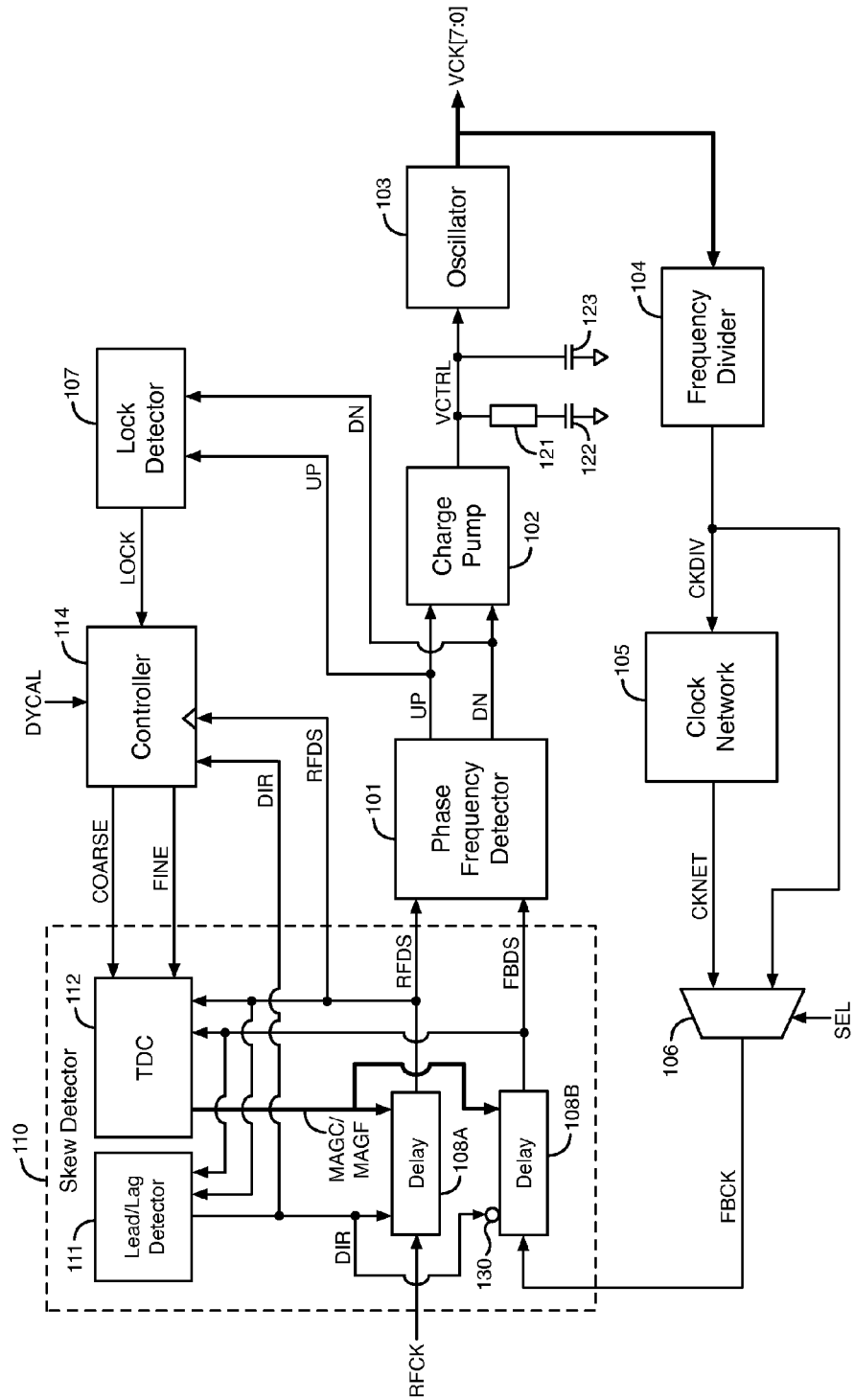
FIG. 1 illustrates an example of a phase-locked loop circuit and a skew reduction circuit, according to an embodiment of the present invention.

FIG. 1 illustrates an example of a phase-locked loop circuit and a skew reduction circuit, according to an embodiment of the present invention. In the embodiment of FIG. 1, the phase-locked loop (PLL) circuit includes a phase frequency detector circuit 101, charge pump circuit 102, oscillator circuit 103, frequency divider circuit 104, clock network 105, multiplexer circuit 106, lock detector circuit 107, and a loop filter. The loop filter in the PLL of FIG. 1 includes resistor 121 and capacitors 122-123. The skew reduction circuit of FIG. 1 includes a skew detector circuit 110 and a controller circuit 114. Skew detector circuit 110 includes delay circuit 108A, delay circuit 108B, lead/lag detector circuit 111, time-to-digital converter (TDC) circuit 112, and inverter circuit 130. In an alternative embodiment, lock detector circuit 107 may be part of the skew reduction circuit instead of the PLL circuit. The circuitry of FIG. 1 is typically in an integrated circuit.

During the operation of the PLL of FIG. 1, a reference clock signal RFCK is provided to an input of delay circuit 108A, and a feedback clock signal FBCK is provided to an input of delay circuit 108B. Delay circuit 108A delays clock signal RFCK to generate reference clock signal RFDS. Delay circuit 108B delays clock signal FBCK to generate feedback clock signal FBDS. Delay circuits 108A-108B are adjustable delay circuits. Lead/lag detector circuit 111 and TDC circuit 112 control the delays of delay circuits 108A-108B. Clock signals RFCK, RFDS, FBCK, and FBDS are all periodic signals having repeating periods. The skew reduction circuit of FIG. 1 reduces or removes any skew between clock signals RFDS and FBDS, as described in detail below.

According to an alternative embodiment, skew detector circuit 110 reduces skew between a reference clock signal and a feedback clock signal that are provided to inputs of a delay-locked loop (DLL) circuit. As an example, a DLL may include a phase detector circuit and a voltage controlled delay line (VCDL) circuit. The phase detector compares the phases of the reference and feedback clock signals to generate a control voltage. The VCDL circuit delays the reference clock signal to generate one or more output clock signals. The VCDL circuit varies the delays provided to its output clock signals in response to changes in the control voltage. One of the output clock signals of the VCDL circuit is used as the feedback clock signal.

Reference clock signal RFDS is provided to a first input of phase frequency detector circuit 101. Feedback clock signal FBDS is provided to a second input of phase frequency detector circuit 101. Phase frequency detector circuit 101 compares the phase and the frequency of reference clock signal RFDS to the phase and the frequency of feedback clock signal FBDS to generate phase error signals UP and DN. Phase frequency detector circuit 101 generates pulses in phase error signals UP and DN that vary based on changes in the differences between the phases and frequencies of clock signals RFDS and FBDS. Phase error signals UP and DN are provided to inputs of charge pump circuit 102 and to inputs of lock detector circuit 107.

Charge pump circuit 102 generates a control voltage VCTRL at its output. Charge pump circuit 102 varies control voltage VCTRL based on changes in the UP and DN phase error signals. The control voltage VCTRL is low pass filtered by the loop filter circuit that includes resistor 121 and capacitors 122-123. Resistor 121 and capacitor 122 are coupled in series between the output of charge pump circuit 102 and a node at a ground voltage. Capacitor 123 is coupled between the output of charge pump circuit 102 and the node at the ground voltage. According to an exemplary embodiment, charge pump circuit 102 sends charge to the loop filter circuit 121-123 in response to logic high pulses in the UP signal, and charge pump circuit 102 drains charge from the loop filter circuit 121-123 in response to logic high pulses in the DN signal.

The control voltage VCTRL as filtered by loop filter circuit 121-123 is provided to a control input of voltage-controlled oscillator (VCO) circuit 103. VCO circuit 103 generates 8 periodic output clock signals VCK[7:0]. VCO circuit 103 varies the frequencies of its output clock signals VCK[7:0] in response to changes in control voltage VCTRL.

The output clock signals VCK[7:0] of VCO circuit 103 are provided to inputs of frequency divider circuit 104. Frequency divider circuit 104 generates a frequency divided clock signal CKDIV based on clock signals VCK[7:0]. Frequency divider circuit 104 causes the frequency of clock signal CKDIV to equal the frequency of each of clock signals VCK[7:0] divided by a frequency division value. The frequency division value of frequency divider circuit 104 may be, for example, a positive integer or fractional number. Clock signal CKDIV is provided to a first multiplexing input of multiplexer circuit 106.

Clock signal CKDIV is also provided to a clock network 105. Clock network 105 may, for example, include conductors, multiplexer circuits, and clock driver circuits. Clock network 105 may provide clock signal CKDIV to destination circuits, such as register circuits and other digital circuits, that are in the same integrated circuit as the circuitry shown in FIG. 1. Clock network 105 generates a clock signal CKNET based on clock signal CKDIV. Clock network 105 may, for example, cause clock signal CKNET to be a delayed version of clock signal CKDIV.

Clock signal CKNET is provided to a second multiplexing input of multiplexer circuit 106. A select signal SEL is provided to a select input of multiplexer circuit 106. Multiplexer circuit 106 generates the feedback clock signal FBCK at its output. When the select signal SEL is in a first logic state, multiplexer circuit 106 generates feedback clock signal FBCK based on clock signal CKNET. When the select signal SEL is in a second logic state, multiplexer circuit 106 generates feedback clock signal FBCK based on clock signal CKDIV. Multiplexer circuit 106 may, for example, provide a very small delay to feedback clock signal FBCK relative to the input clock signal CKNET or CKDIV that is selected by select signal SEL. Select signal SEL determines whether the PLL generates an indirect feedback clock signal FBCK through clock network 105 or a direct feedback clock signal FBCK that bypasses clock network 105.

According to an exemplary embodiment, phase frequency detector circuit 101 generates logic high pulses in the UP signal that are longer than the logic high pulses in the DN signal when the frequency of reference clock signal RFDS is greater than the frequency of feedback clock signal FBDS. When logic high pulses in the UP signal are longer than logic high pulses in the DN signal, charge pump circuit 102 increases the control voltage VCTRL. In response to control voltage VCTRL increasing, VCO circuit 103 increases the frequencies of clock signals VCK[7:0], which causes the frequency of each of the clock signals CKDIV, CKNET, and FBCK to increase.

In this embodiment, phase frequency detector circuit 101 generates logic high pulses in the DN signal that are longer than the logic high pulses in the UP signal when the frequency of feedback clock signal FBDS is greater than the frequency of reference clock signal RFDS. When logic high pulses in the DN signal are longer than logic high pulses in the UP signal, charge pump circuit 102 decreases control voltage VCTRL. In response to control voltage VCTRL decreasing, VCO circuit 103 decreases the frequencies of clock signals VCK[7:0], which causes the frequency of each of the clock signals CKDIV, CKNET, and FBCK to decrease.

VCO circuit 103 varies the frequencies of clock signals VCK[7:0] based on changes in the control voltage VCTRL, until the reference clock signal RFDS and the feedback clock signal FBDS are phase aligned within a static phase offset of the PLL. The static phase offset is an error margin of the PLL. Clock signals RFDS and FBDS have the same or approximately the same frequency when the phases of clock signals RFDS and FBDS are aligned within the static phase offset. The PLL of FIG. 1 is in lock when the reference clock signal RFDS and the feedback clock signal FBDS are aligned in phase within the static phase offset.

Lock detector circuit 107 generates a LOCK signal based on the phase error signals UP and DN. Lock detector circuit 107 asserts the LOCK signal to a logic high state when the PLL of FIG. 1 is in lock. Lock detector circuit 107 de-asserts the LOCK signal to a logic low state when the PLL of FIG. 1 is not in lock. As an example, lock detector circuit 107 may generate a logic high state in the LOCK signal if the durations of the logic high pulses in the UP signal are the same as the durations of the logic high pulses in the DN signal within a margin of error, indicating that the phases of clock signals RFDS and FBDS are aligned within the static phase offset.

The LOCK signal is provided to an input of controller circuit 114. A dynamic calibration enable signal DYCAL and a directional signal DIR are provided to additional inputs of controller circuit 114. The directional signal DIR is generated by lead/lag detector circuit 111. The reference clock signal RFDS is provided to a clock input of controller circuit 114. Controller circuit 114 controls the operation of skew detector circuit 110. Controller circuit 114 generates two control signals COARSE and FINE based on signals LOCK, DIR, DYCAL, and RFDS.

Control signals COARSE and FINE are provided to inputs of TDC circuit 112. Controller circuit 114 uses control signals COARSE and FINE to control the operation of skew detector circuit 110. Controller circuit 114 asserts the COARSE control signal to cause skew detector circuit 110 to function in a coarse skew compensation mode. In the coarse skew compensation mode, TDC circuit 112 measures a coarse skew between clock signals RFDS and FBDS. Skew detector circuit 110 then adjusts the delay of at least one of delay circuits 108A-108B to compensate for the coarse skew between clock signals RFDS and FBDS. The coarse skew is a coarse measurement of the time difference between the phases of clock signals RFDS and FBDS when the PLL is in lock.

Controller circuit 114 asserts the FINE control signal to cause skew detector circuit 110 to function in a fine skew compensation mode. In the fine skew compensation mode, TDC circuit 112 measures a fine skew between clock signals RFDS and FBDS. Skew detector circuit 110 then adjusts the delay of at least one of delay circuits 108A-108B to compensate for the fine skew between clock signals RFDS and FBDS. The fine skew is a fine measurement of the time difference between the phases of clock signals RFDS and FBDS when the PLL is in lock. The fine skew between clock signals RFDS and FBDS is measured with a higher resolution than the coarse skew.

Clock signals RFDS and FBDS are provided to additional inputs of TDC circuit 112. TDC circuit 112 generates a set of coarse delay control signals MAGC based on the coarse skew between clock signals RFDS and FBDS in response to control signal COARSE being asserted. TDC circuit 112 generates a set of fine delay control signals MAGF based on the fine skew between clock signals RFDS and FBDS in response to control signal FINE being asserted. The coarse and fine delay control signals MAGC and MAGF (shown as MAGC/MAGF in FIG. 1) are provided to inputs of delay circuit 108A and to inputs of delay circuit 108B. The coarse and fine delay control signals MAGC and MAGF control the delay of one of the delay circuits 108A-108B at a time. The delays that delay circuits 108A-108B provide to clock signals RFDS and FBDS relative to clock signals RFCK and FBCK, respectively, are determined based on the delay control signals MAGC and MAGF and the directional signal DIR.

Clock signals RFDS and FBDS are provided to inputs of lead/lag detector circuit 111. Lead/lag detector circuit 111 generates the directional signal DIR based on clock signals RFDS and FBDS. Lead/lag detector circuit 111 causes the directional signal DIR to indicate which of the clock signals RFDS or FBDS has a phase that is leading the phase of the other clock signal. The directional signal DIR (i.e., signal DIR) is provided to an input of delay circuit 108A. Signal DIR is also provided to an input of inverter circuit 130. Inverter circuit 130 inverts signal DIR to generate an inverted DIR signal. The inverted DIR signal is provided to an input of delay circuit 108B. The inverted DIR signal has the opposite logic state of signal DIR.

The delay of only one of the delay circuits 108A or 108B is controlled by the delay control signals MAGC and MAGF at any one time. Signal DIR determines whether the delay of delay circuit 108A or the delay of delay circuit 108B is controlled by the delay control signals MAGC and MAGF. In an embodiment, when signal DIR is in a logic high state, delay control signals MAGC and MAGF control the delay of delay circuit 108A. In this embodiment, when signal DIR is in a logic low state, delay control signals MAGC and MAGF control the delay of delay circuit 108B.

Figure 2:
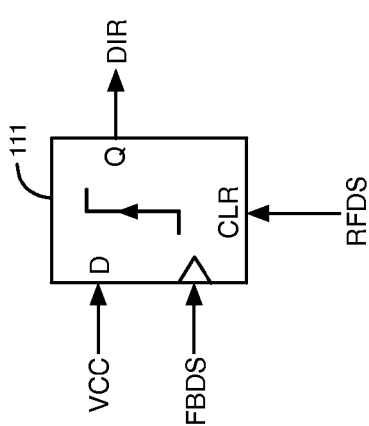
FIG. 2 illustrates an example of the lead/lag detector circuit of FIG. 1, according to an embodiment of the present invention.

FIG. 2 illustrates an example of lead/lag detector circuit 111, according to an embodiment of the present invention. In the embodiment of FIG. 2, lead/lag detector circuit 111 is a D flip-flop circuit. A supply voltage VCC is provided to the D input of D flip-flop circuit 111. The feedback clock signal FBDS is provided to the clock input of D flip-flop circuit 111. The reference clock signal RFDS is provided to the clear (CLR) input of D flip-flop circuit 111. D flip-flop circuit 111 generates the directional signal DIR at its Q output.

Flip-flop circuit 111 interprets the supply voltage VCC at its D input as a digital signal that is constantly in a logic high state. When a rising edge occurs in feedback clock signal FBDS before a rising edge in reference clock signal RFDS, flip-flop circuit 111 causes signal DIR to be in a logic high state. Flip-flop circuit 111 maintains signal DIR in a logic high state as long as the rising edges in the feedback clock signal FBDS occur before the rising edges in the reference clock signal RFDS. A rising edge refers to a logic low-to-high transition in a digital signal.

When a rising edge occurs in the reference clock signal RFDS before a rising edge in the feedback clock signal FBDS, flip-flop circuit 111 causes signal DIR to be in a logic low state. Flip-flop circuit 111 maintains signal DIR in a logic low state as long as the rising edges in the reference clock signal RFDS occur before the rising edges in the feedback clock signal FBDS.

Figure 3:
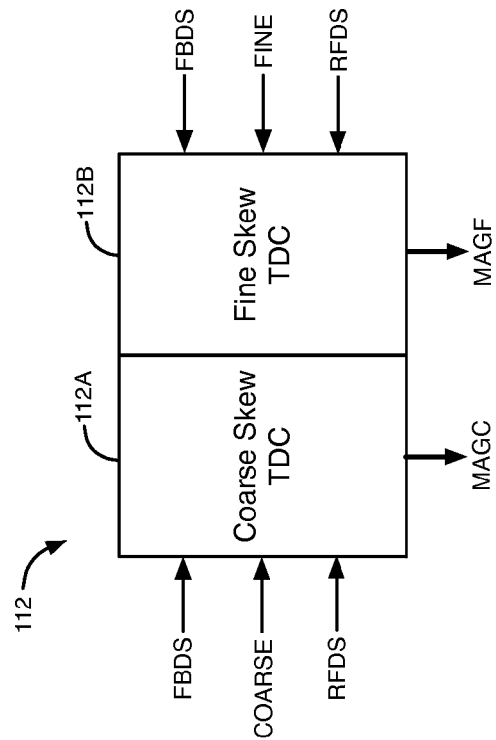
FIG. 3 illustrates an example of the time-to-digital converter (TDC) circuit of FIG. 1, according to an embodiment of the present invention.

FIG. 3 illustrates an example of time-to-digital converter (TDC) circuit 112, according to an embodiment of the present invention. TDC circuit 112 includes coarse skew time-to-digital converter (TDC) circuit 112A and fine skew time-to-digital converter (TDC) circuit 112B. TDC circuit 112A measures the coarse skew between clock signals RFDS and FBDS in coarse discrete steps. TDC circuit 112B measures the fine skew between clock signals RFDS and FBDS in fine discrete steps. The coarse discrete steps are larger than the fine discrete steps. Thus, the fine skew has a higher resolution than the coarse skew.

Clock signals RFDS and FBDS and control signal COARSE are provided to inputs of coarse skew TDC circuit 112A. Coarse skew TDC circuit 112A generates the coarse delay control signals MAGC based on control signal COARSE and clock signals RFDS and FBDS. Clock signals RFDS and FBDS and control signal FINE are provided to inputs of fine skew TDC circuit 112B. Fine skew TDC circuit 112B generates the fine delay control signals MAGF based on control signal FINE and clock signals RFDS and FBDS.

Figure 4:
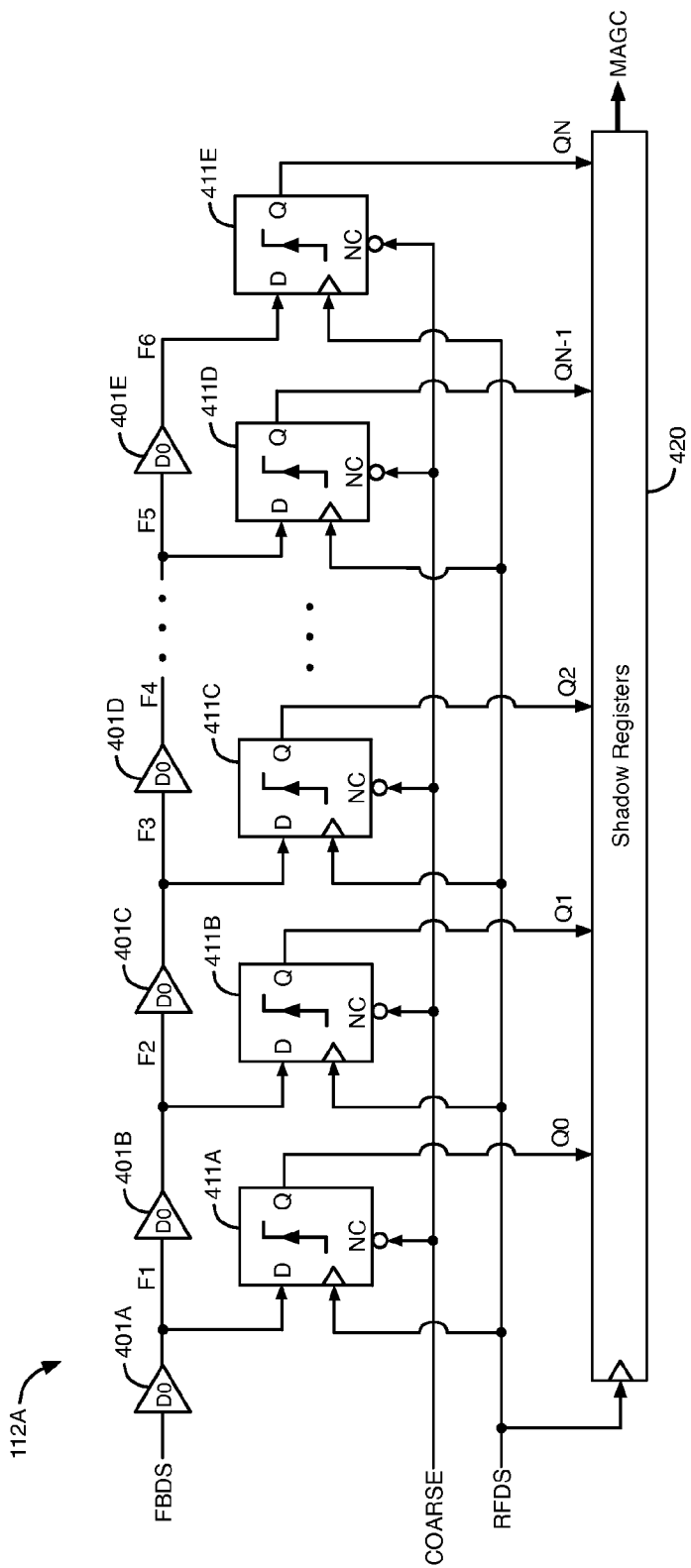
FIG. 4 illustrates an example of the coarse skew time-to-digital converter (TDC) circuit shown in FIG. 3, according to an embodiment of the present invention.

FIG. 4 illustrates an example of coarse skew time-to-digital converter (TDC) circuit 112A, according to an embodiment of the present invention. Coarse skew TDC circuit 112A measures the coarse skew between clock signals RFDS and FBDS. Coarse skew TDC circuit 112A causes the coarse delay control signals MAGC to indicate the coarse skew between clock signals RFDS and FBDS.

Coarse skew time-to-digital converter (TDC) circuit 112A includes non-inverting delay circuits 401, D flip-flop circuits 411, and shadow registers circuit 420. TDC circuit 112A includes an N+1 number of delay circuits 401 and an N+1 number of flip-flop circuits 411, where N is any suitable positive integer. Five delay circuits 401A-401E and five flip-flop circuits 411A-411E are shown in FIG. 4 as an example.

Delay circuits 401 are coupled in series as a delay line to generate an N+1 number of delayed clock signals by sequentially delaying clock signal FBDS. Each of the delay circuits 401 provides the same delay D0. Clock signal FBDS is provided to an input of delay circuit 401A. Delay circuit 401A delays clock signal FBDS by delay D0 to generate a delayed clock signal F1 at its output. Each of the subsequent delay circuits 401 in the delay line delays the clock signal generated by the previous delay circuit 401 in the delay line by delay D0 to generate another delayed clock signal. For example, delay circuits 401B, 401C, 401D, and 401E delay clock signals F1, F2, F3, and F5 to generate delayed clock signals F2, F3, F4, and F6, respectively, at their outputs.

The delayed clock signal generated by each of the delay circuits 401 in the delay line is provided to a D input of a respective one of the flip-flop circuits 411. For example, delayed clock signals F1, F2, F3, F5, and F6 are provided to the D inputs of flip-flop circuits 411A, 411B, 411C, 411D, and 411E, respectively. Delayed clock signal F5 is generated by one of the delay circuits 401 not shown in FIG. 4.

Control signal COARSE is provided to the not clear (NC) input of each of the flip-flop circuits 411. Each of the flip-flop circuits 411 generates a signal that is stored at its Q output. For example, flip-flop circuits 411A-411E generate signals Q0, Q1, Q2, QN−1, and QN, respectively, that are stored at their Q outputs. In response to a falling edge in control signal COARSE, each of the flip-flop circuits 411 clears the signal stored at its Q output to a logic low state. A falling edge refers to a logic high-to-low transition in a digital signal. Flip-flop circuits 411 maintain the signals stored at their Q outputs in logic low states in response to control signal COARSE remaining in a logic low state.

Reference clock signal RFDS is provided to the clock input of each of the flip-flop circuits 411. Each of flip-flop circuits 411 provides the logic state of the delayed clock signal at its D input to the signal stored at its Q output in response to each rising edge in reference clock signal RFDS that occurs while control signal COARSE is in a logic high state.

Control signal COARSE is asserted to a logic high state to begin the operation of TDC circuit 112A. During the operation of TDC circuit 112A, the rising and falling edges in clock signal FBDS propagate from left to right through delay circuits 401 in the delay line. Each delay circuit 401 outputs rising and falling edges in its output clock signal after imposing a delay D0 on its output clock signal relative to its input clock signal. Each rising edge in clock signal RFDS causes flip-flop circuits 411 to store the values of the output clock signals of delay circuits 401 at their Q outputs. The flip-flop circuits 411 that have logic high states at their D inputs at a rising edge in clock signal RFDS store logic high states at their Q outputs. The flip-flop circuits 411 that store logic high states at their Q outputs received rising edges propagating through delay circuits 401 before receiving a rising edge in clock signal RFDS. The flip-flop circuits 411 that have logic low states at their D inputs at a rising edge in clock signal RFDS store logic low states at their Q outputs. The flip-flop circuits 411 that store logic low states at their Q outputs received a rising edge in clock signal RFDS before receiving rising edges propagating through delay circuits 401. The number of flip-flop circuits 411 that store logic high states at their Q outputs in response to a rising edge in clock signal RFDS indicates the coarse skew between clock signals RFDS and FBDS.

The coarse skew CS between clock signals RFDS and FBDS is calculated using the equation CS=X×D0, where X is the number of flip-flop circuits 411 that stored logic high states at their Q outputs in response to a rising edge in clock signal RFDS. The signals stored at the Q outputs of flip-flop circuits 411 are a thermometer code that indicates the coarse skew between clock signals RFDS and FBDS in coarse discrete steps. The resolution of the coarse skew between clock signals RFDS and FBDS that is detectable by TDC circuit 112A is determined by the duration of delay D0.

As an example, if delayed clock signals F1-F2 are in logic high states and the remaining delayed clock signals generated by delay circuits 401 including delayed clock signals F3-F6 are in logic low states at a rising edge of clock signal RFDS, flip-flop circuits 411 store values of 110 . . . 00 at their Q outputs in signals Q0, Q1, Q2, . . . QN−1, and QN, respectively. 1 indicates a logic high state in a corresponding signal, and 0 indicates a logic low state in a corresponding signal. In this example, signals Q0-Q1 are in logic high states, indicating that the coarse skew between clock signals RFDS and FBDS equals 2×D0.

The signals Q0-QN stored at the Q outputs of flip-flop circuits 411 are provided in parallel to inputs of shadow registers circuit 420. Reference clock signal RFDS is provided to the clock input of shadow registers circuit 420. Shadow registers circuit 420 stores the values of the signals Q0-QN received from the Q outputs of flip-flop circuits 411 in response to clock signal RFDS. Shadow registers circuit 420 outputs the stored values of the signals Q0-QN received from the Q outputs of flip-flop circuits 411 in parallel in the coarse delay control signals MAGC. Shadow registers circuit 420 may, for example, update the values of the coarse delay control signals MAGC in response to each rising edge or each falling edge of clock signal RFDS. The values of the coarse delay control signals MAGC are a thermometer code that indicates the coarse skew between clock signals RFDS and FBDS. The coarse delay control signals MAGC are also referred to herein as an N+1 number of signals MAGC[N:0]. Shadow registers circuit 420 prevents unintended PLL loop disturbances that are caused by dynamic skew compensation.

Figure 5:
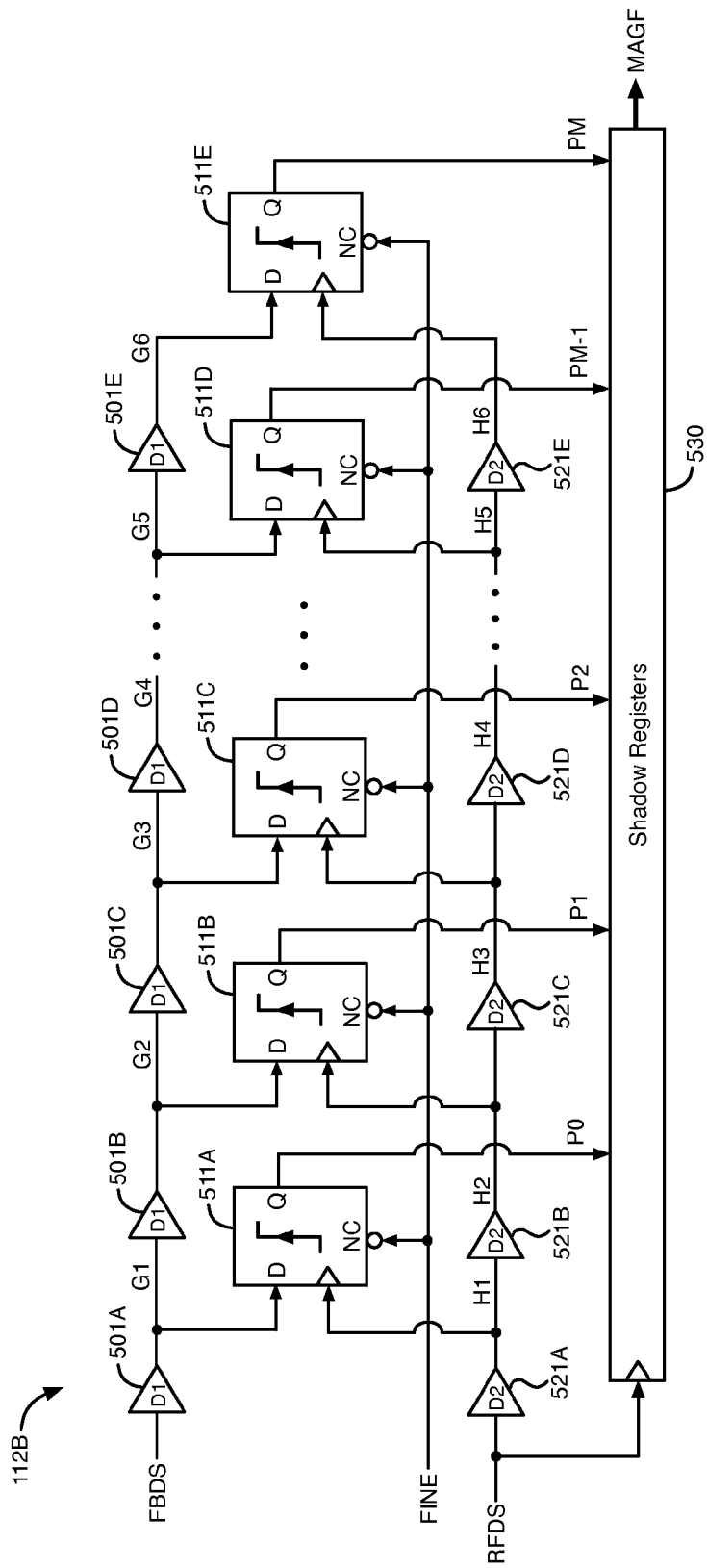
FIG. 5 illustrates an example of the fine skew time-to-digital converter (TDC) circuit shown in FIG. 3, according to an embodiment of the present invention.

FIG. 5 illustrates an example of fine skew time-to-digital converter (TDC) circuit 112B, according to an embodiment of the present invention. Fine skew TDC circuit 112B measures the fine skew between clock signals RFDS and FBDS. Fine skew TDC circuit 112B causes the fine delay control signals MAGF to indicate the fine skew between clock signals RFDS and FBDS. TDC circuit 112B is a Vernier TDC circuit.

Fine skew TDC circuit 112B includes non-inverting delay circuits 501, D flip-flop circuits 511, non-inverting delay circuits 521, and shadow registers circuit 530. TDC circuit 112B includes an M+1 number of delay circuits 501, an M+1 number of flip-flop circuits 511, and an M+1 number of delay circuits 521, where M is any suitable positive integer. Five delay circuits 501A-501E, five flip-flop circuits 511A-511E, and five delay circuits 521A-521E are shown in FIG. 5 as an example.

Delay circuits 501 are coupled in series as a delay line to generate an M+1 number of delayed clock signals by sequentially delaying clock signal FBDS. Each of the delay circuits 501 provides the same delay D1. Clock signal FBDS is provided to an input of delay circuit 501A. Delay circuit 501A delays clock signal FBDS by delay D1 to generate a delayed clock signal G1 at its output. Each of the subsequent delay circuits 501 in the delay line delays the clock signal generated by the previous delay circuit 501 in the delay line by delay D1 to generate another delayed clock signal. For example, delay circuits 501B, 501C, 501D, and 501E delay clock signals G1, G2, G3, and G5 to generate delayed clock signals G2, G3, G4, and G6, respectively, at their outputs.

The delayed clock signal generated by each of the delay circuits 501 in the delay line is provided to a D input of a respective one of flip-flop circuits 511. For example, delayed clock signals G1, G2, G3, G5, and G6 are provided to the D inputs of flip-flop circuits 511A, 511B, 511C, 511D and 511E, respectively. Delayed clock signal G5 is generated by one of the delay circuits 501 not shown in FIG. 5.

Delay circuits 521 are coupled in series as a delay line to generate an M+1 number of delayed clock signals by sequentially delaying reference clock signal RFDS. Each of the delay circuits 521 provides the same delay D2. Delay D1 is greater than delay D2. Clock signal RFDS is provided to an input of delay circuit 521A. Delay circuit 521A delays clock signal RFDS by delay D2 to generate a delayed clock signal H1 at its output. Each of the subsequent delay circuits 521 in the delay line delays the clock signal generated by the previous delay circuit 521 in the delay line by delay D2 to generate another delayed clock signal. For example, delay circuits 521B, 521C, 521D, and 521E delay clock signals H1, H2, H3, and H5 to generate delayed clock signals H2, H3, H4, and H6, respectively, at their outputs.

Control signal FINE is provided to the not clear (NC) input of each of flip-flop circuits 511. Each of flip-flop circuits 511 generates a signal that is stored at its Q output. For example, flip-flop circuits 511A-511E generate signals P0, P1, P2, PM−1, and PM, respectively, that are stored at their Q outputs. In response to a falling edge in control signal FINE, each of flip-flop circuits 511 clears the signal stored at its Q output to a logic low state. Flip-flop circuits 511 maintain the signals stored at their Q outputs in logic low states in response to control signal FINE remaining in a logic low state.

The delayed clock signals generated by delay circuits 521 are provided to the clock inputs of flip-flop circuits 511. For example, delayed clock signals H1, H2, H3, H5, and H6 are provided to the clock inputs of flip-flop circuits 511A-511E, respectively. Each of flip-flop circuits 511 provides the logic state of the delayed clock signal at its D input to its Q output in response to each rising edge in the delayed clock signal at its clock input that occurs while control signal FINE is in a logic high state.

In an embodiment, control signal COARSE is first asserted to a logic high state to cause TDC circuit 112A to output the coarse skew between clock signals RFDS and FBDS, as described above. Subsequently, control signal COARSE is de-asserted to a logic low state, and control signal FINE is asserted to a logic high state to cause TDC circuit 112B to output the fine skew between clock signals RFDS and FBDS. In this embodiment, the coarse skew and the fine skew are generated at different times.

Control signal FINE is asserted to a logic high state to begin the operation of TDC circuit 112B. During the operation of TDC circuit 112B, the rising and falling edges in clock signal FBDS propagate from left to right through delay circuits 501, and the rising and falling edges in clock signal RFDS propagate from left to right through delay circuits 521. Each of the flip-flop circuits 511 stores the logic state of the output clock signal of a respective one of the delay circuits 501 at its Q output in response to a rising edge in the clock signal at its clock input. The flip-flop circuits 511 that have logic high states at their D inputs at rising edges in the clock signals at their clock inputs store logic high states at their Q outputs. The flip-flop circuits 511 that store logic high states at their Q outputs received rising edges propagating through delay circuits 501 before receiving rising edges propagating through delay circuits 521. The flip-flop circuits 511 that have logic low states at their D inputs at rising edges in the clock signals at their clock inputs store logic low states at their Q outputs. The flip-flop circuits 511 that store logic low states at their Q outputs received rising edges propagating through delay circuits 521 before receiving rising edges propagating through delay circuits 501. After a rising edge in clock signal RFDS propagates through delay circuits 521, the number of flip-flop circuits 511 that store logic high states at their Q outputs indicates the fine skew between clock signals RFDS and FBDS.

The fine skew FS between clock signals RFDS and FBDS is calculated using the equation $FS=Y\times(D1-D2)$, where Y is the number of flip-flop circuits 511 that stored logic high states at their Q outputs in response to rising edges in the clock signals at their clock inputs. The signals stored at the Q outputs of flip-flop circuits 511 are a thermometer code that indicates the fine skew between clock signals RFDS and FBDS in fine discrete steps. The resolution of the fine skew between clock signals RFDS and FBDS that is detectable by TDC circuit 112B equals $D1-D2$.

The signals P0-PM stored at the Q outputs of flip-flop circuits 511 are provided in parallel to inputs of shadow registers circuit 530. Reference clock signal RFDS is provided to the clock input of shadow registers circuit 530. Shadow registers circuit 530 stores the values of the signals P0-PM received from the Q outputs of flip-flop circuits 511 in response to clock signal RFDS. Shadow registers circuit 530 outputs the stored values of the signals received from the Q outputs of flip-flop circuits 511 in parallel in fine delay control signals MAGF. Shadow registers circuit 530 may, for example, update the values of the fine delay control signals MAGF in response to each rising edge or each falling edge in clock signal RFDS. The values of the fine delay control signals MAGF are a thermometer code that indicates the fine skew between clock signals RFDS and FBDS. The fine delay control signals MAGF are also referred to herein as an M+1 number of signals MAGF[M:0]. The fine skew indicated by the fine delay control signals MAGF is a residual skew that was not measured by TDC circuit 112A during the coarse skew measurement. Shadow registers circuit 530 prevents unintended PLL loop disturbances caused by dynamic skew compensation.

Figure 6:
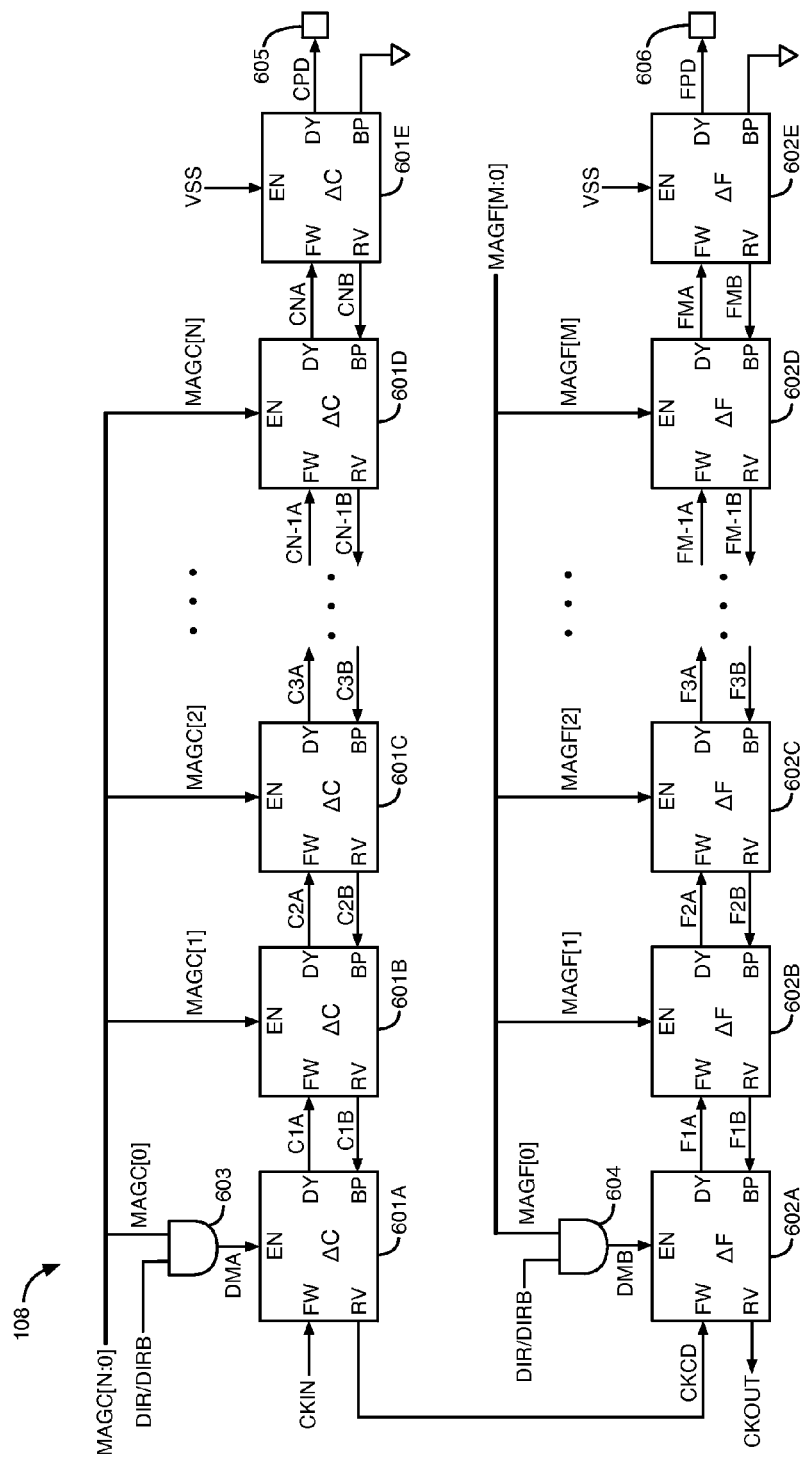
FIG. 6 illustrates an example of each of the delay circuits of FIG. 1, according to an embodiment of the present invention.

FIG. 6 illustrates an example of a delay circuit 108, according to an embodiment of the present invention. Delay circuit 108 shown in FIG. 6 is an example of each of the delay circuits 108A and 108B shown in FIG. 1. In an embodiment, each of the delay circuits 108A and 108B in skew detector circuit 110 includes an instance of the circuitry shown in FIG. 6. In the embodiment of FIG. 6, delay circuit 108 includes delay circuits 601, delay circuits 602, AND logic gate circuits 603-604, and pads 605-606. Delay circuit 108 includes an N+2 number of delay circuits 601 and an M+2 number of delay circuits 602. N and M in the embodiment of FIG. 6 are the same numbers described above with respect to FIGS. 4-5, respectively. N and M may be the same or different positive integer numbers. Five delay circuits 601A-601E and five delay circuits 602A-602E are shown in FIG. 6 as an example.

Each of the coarse delay control signals MAGC[N:1] is provided to the enable input EN of one of delay circuits 601. For example, signals MAGC[1], MAGC[2], and MAGC[N] are provided to the enable inputs EN of delay circuits 601B, 601C, and 601D, respectively. Each of the fine delay control signals MAGF[M:1] is provided to the enable input EN of one of delay circuits 602. For example, control signals MAGF[1], MAGF[2], and MAGF[M] are provided to the enable inputs EN of delay circuits 602B, 602C, and 602D, respectively.

The first coarse delay control signal MAGC[0] is provided to a first input of AND gate circuit 603. The first fine delay control signal MAGF[0] is provided to a first input of AND gate circuit 604. In delay circuit 108A, directional signal DIR is provided to the second inputs of AND gate circuits 603-604. In delay circuit 108B, inverted directional signal DIRB is provided to the second inputs of AND gate circuits 603-604. Inverter circuit 130 generates signal DIRB by inverting signal DIR. Signal DIRB is the logical inverse of signal DIR.

AND gate circuit 603 performs an AND logic function on signal MAGC[0] and signal DIR or DIRB to generate a signal DMA at the EN input of delay circuit 601A. In response to signal DIR/DIRB being in a logic high state, AND gate circuit 603 provides the logic state of signal MAGC[0] to signal DMA at the EN input of delay circuit 601A. In response to signal DIR/DIRB being in a logic low state, AND gate circuit 603 maintains signal DMA at the EN input of delay circuit 601A in a logic low state.

AND gate circuit 604 performs an AND logic function on signal MAGF[0] and signal DIR or DIRB to generate a signal DMB at the EN input of delay circuit 602A. In response to signal DIR/DIRB being in a logic high state, AND gate circuit 604 provides the logic state of signal MAGF[0] to signal DMB at the EN input of delay circuit 602A. In response to signal DIR/DIRB being in a logic low state, AND gate circuit 604 maintains signal DMB at the EN input of delay circuit 602A in a logic low state.

Delay circuits 601 are coupled in series as a delay line. One or more of delay circuits 601 delays an input clock signal CKIN to generate a clock signal CKCD. Input clock signal CKIN is provided to the forward input FW of delay circuit 601A, and clock signal CKCD is generated at the reverse output RV of delay circuit 601A. Delay circuits 602 are coupled in series as a delay line. One or more of delay circuits 602 delays clock signal CKCD to generate output clock signal CKOUT. Clock signal CKCD is provided to the forward input FW of delay circuit 602A, and output clock signal CKOUT is generated at the reverse output RV of delay circuit 602A.

In delay circuit 108A, reference clock signal RFCK is input clock signal CKIN in FIG. 6, and reference clock signal RFDS is output clock signal CKOUT in FIG. 6. In delay circuit 108B, feedback clock signal FBCK is input clock signal CKIN in FIG. 6, and feedback clock signal FBDS is output clock signal CKOUT in FIG. 6.

Signals CKIN, C1A, C2A, CN-1A, CNA, CKCD, F1A, F2A, FM-1A, and FMA are provided to the forward inputs FW of delay circuits 601A, 601B, 601C, 601D, 601E, 602A, 602B, 602C, 602D, and 602E, respectively. Signals C1A, C2A, C3A, CNA, CPD, F1A, F2A, F3A, FMA, and FPD are generated at the delay outputs DY of delay circuits 601A, 601B, 601C, 601D, 601E, 602A, 602B, 602C, 602D, and 602E, respectively. Signal CPD is provided to pad 605, and signal FPD is provided to pad 606. Pads 605-606 are external terminals of the integrated circuit. The bypass inputs BP of delay circuits 601E and 602E are coupled to a node at the ground voltage.

Signals FMB, F3B, F2B, F1B, CNB, C3B, C2B, and C1B are provided to the bypass inputs BP of delay circuits 602D, 602C, 602B, 602A, 601D, 601C, 601B, and 601A, respectively. Signals FMB, FM-1B, F2B, F1B, CKOUT, CNB, CN-1B, C2B, C1B, and CKCD are generated at the reverse outputs RV of delay circuits 602E, 602D, 602C, 602B, 602A, 601E, 601D, 601C, 601B, and 601A, respectively.

Each of delay circuits 601 has a forward path, a reverse path, and a bypass path. Each of the delay circuits 601 that receives a logic high state at its EN input from a respective one of control signals MAGC[N:0] delays the clock signal at its FW input by a coarse delay ΔC in its forward path to generate a delayed clock signal at its DY output. The coarse delay ΔC equals each of the coarse discrete steps mentioned above. The first delay circuit 601 in the delay line to receive a logic low state at its EN input provides the clock signal received at its FW input to its RV output through its reverse path with a negligible delay. Each of the delay circuits 601 that receives a logic high state at its EN input from a respective one of control signals MAGC[N:0] provides the clock signal at its BP input to its RV output with a negligible delay through its bypass path.

In the embodiment of FIG. 6, control signals MAGC[N:0] are thermometer encoded. When signal DIR/DIRB is in a logic high state, the number of control signals MAGC[N:0] that are in logic high states equals the number of delay circuits 601 that add a coarse delay ΔC to clock signal CKCD relative to input clock signal CKIN. Delay circuits 601 provide a combined delay of Y×ΔC to clock signal CKCD relative to input clock signal CKIN in response to signal DIR/DIRB being in a logic high state. Y is the number of control signals MAGC[N:0] that are in logic high states.

As an example, if control signals MAGC[0], MAGC[1], MAGC[2], and MAGC[N] have logic states of 1, 1, 0 and 0, respectively, and signal DIR/DIRB is in a logic high state, delay circuits 601A-601B provide a delay of 2×ΔC to clock signal C2A relative to input clock signal CKIN. In this example, delay circuit 601C provides rising and falling edges in clock signal C2A to clock signal C2B with a negligible delay, and delay circuits 601A-601B provide rising and falling edges in clock signal C2B to clock signal CKCD with a negligible delay.

A low voltage VSS is provided to the EN input of delay circuit 601E. Voltage VSS indicates a logic low state and may be the ground voltage. In response to voltage VSS at its EN input, delay circuit 601E provides the signal CNA at its FW input to its RV output in signal CNB through its reverse path with a negligible delay.

In response to all of control signals MAGC[N:0] being in logic high states, and signal DIR/DIRB being in a logic high state, rising and falling edges in clock signal CKIN propagate from the FW input of delay circuit 601A through the forward paths in delay circuits 601A through 601D to signal CNA. The rising and falling edges in signal CNA propagate from the FW input to the RV output of delay circuit 601E through its reverse path to generate signal CNB. The rising and falling edges in signal CNB propagate from the BP input of delay circuit 601D through the bypass paths in delay circuits 601D through 601A to clock signal CKCD.

Each of delay circuits 602 has a forward path, a reverse path, and a bypass path. Each of the delay circuits 602 that receives a logic high state from a respective one of control signals MAGF[M:0] at its EN input delays the clock signal at its FW input by a fine delay ΔF in its forward path to generate a delayed clock signal at its DY output. The fine delay ΔF equals each of the fine discrete steps mentioned above. The fine delay ΔF is less than the coarse delay ΔC. As specific examples that are not intended to be limiting, the fine delay ΔF may be ½, ⅓, ¼, ⅕, ⅒, or 1/20 of the coarse delay ΔC.

The first delay circuit 602 in the delay line to receive a logic low state at its EN input provides the clock signal received at its FW input to its RV output through its reverse path with a negligible delay. Each of the delay circuits 602 that receives a logic high state from a respective one of control signals MAGF[M:0] at its EN input provides the clock signal at its BP input to its RV output through its bypass path with a negligible delay.

In the embodiment of FIG. 6, control signals MAGF[M:0] are thermometer encoded. When signal DIR/DIRB is in a logic high state, the number of control signals MAGF[M:0] that are in logic high states equals the number of delay circuits 602 that add a fine delay ΔF to output clock signal CKOUT relative to clock signal CKCD. Delay circuits 602 provide a combined delay of Z×ΔF to clock signal CKOUT relative to clock signal CKCD in response to signal DIR/DIRB being in a logic high state. Z is the number of control signals MAGF[M:0] that are in logic high states. Delay circuits 601 and 602 provide a total delay of (Y×ΔC)+(Z×ΔF) to output clock signal CKOUT relative to input clock signal CKIN when signal DIR/DIRB is in a logic high state.

As an example, if control signals MAGF[0], MAGF[1], MAGF[2], and MAGF[M] have logic states of 1, 0, 0 and 0, respectively, and signal DIR/DIRB is in a logic high state, delay circuit 602A provides a delay of 1×ΔF to clock signal F1A relative to clock signal CKCD. In this example, delay circuit 602B provides rising and falling edges in clock signal F1A to clock signal F1B with a negligible delay, and delay circuit 602A provides rising and falling edges in clock signal F1B to clock signal CKOUT with a negligible delay.

Voltage VSS is provided to the EN input of delay circuit 602E. In response to voltage VSS at its EN input, delay circuit 602E provides the signal FMA at its FW input to its RV output in signal FMB through its reverse path.

In response to all of control signals MAGF[M:0] being in logic high states, and signal DIR/DIRB being in a logic high state, rising and falling edges in clock signal CKCD propagate from the FW input of delay circuit 602A through the forward paths in delay circuits 602A through 602D to signal FMA. The rising and falling edges in signal FMA propagate from the FW input to the RV output of delay circuit 602E through its reverse path to generate signal FMB. The rising and falling edges in signal FMB propagate from the BP input of delay circuit 602D through the bypass paths in delay circuits 602D through 602A to clock signal CKOUT.

Figure 7B:
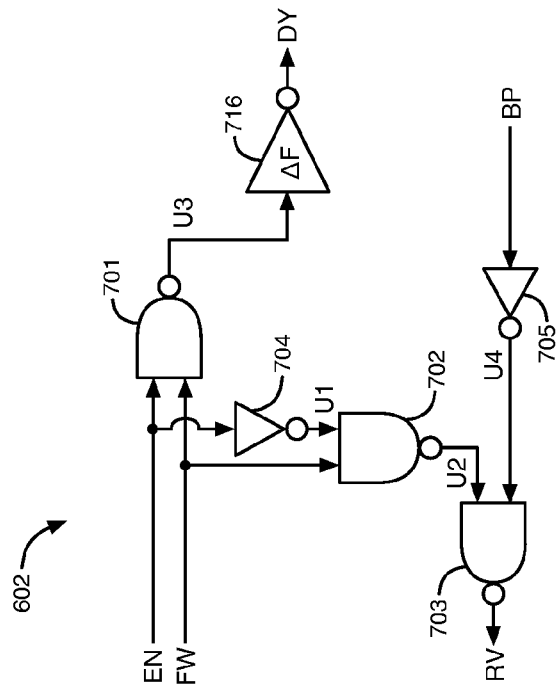
FIG. 7B illustrates an example of each of the fine delay circuits shown in FIG. 6, according to an embodiment of the present invention.
Figure 7A:
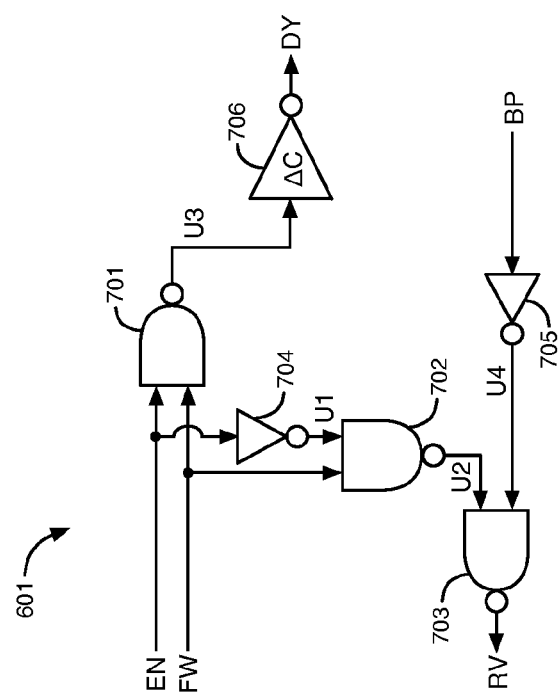
FIG. 7A illustrates an example of each of the coarse delay circuits shown in FIG. 6, according to an embodiment of the present invention.

FIG. 7A illustrates an example of each of the delay circuits 601, according to an embodiment of the present invention. FIG. 7B illustrates an example of each of the delay circuits 602, according to an embodiment of the present invention. In an embodiment, each of the delay circuits 601 (including delay circuits 601A-601E) in delay circuit 108 of FIG. 6 includes an instance of the circuitry shown in FIG. 7A, and each of the delay circuits 602 (including delay circuits 602A-602E) in delay circuit 108 of FIG. 6 includes an instance of the circuitry shown in FIG. 7B.

In FIG. 7A, delay circuit 601 includes NAND logic gate circuits 701-703, inverter circuits 704-705, and delay circuit 706. The delay of delay circuit 706 is the coarse delay ΔC. Each of the NAND logic gate circuits 701-703 and inverter circuits 704-705 has a small or negligible delay relative to coarse delay ΔC. The forward path of delay circuit 601 includes NAND logic gate circuit 701 and delay circuit 706. The reverse path of delay circuit 601 includes NAND logic gate circuits 702-703. The bypass path of delay circuit 601 includes inverter circuit 705 and NAND logic gate circuit 703.

The signal received at the FW input of delay circuit 601 is provided to a first input of NAND logic gate circuit 701 and to a first input of NAND logic gate circuit 702. The signal received at the EN input of delay circuit 601 is provided to a second input of NAND logic gate circuit 701 and to the input of inverter circuit 704. Inverter circuit 704 inverts the signal received at the EN input to generate a signal U1 that is provided to a second input of NAND logic gate circuit 702. NAND logic gate circuit 702 performs a NAND Boolean function on the logic states of signal U1 and the signal at the FW input to generate a signal U2.

Inverter circuit 705 inverts the signal received at the BP input of delay circuit 601 to generate a signal U4. Signals U2 and U4 are provided to inputs of NAND logic gate circuit 703. NAND logic gate circuit 703 performs a NAND Boolean function on the logic states of signals U2 and U4 to generate a signal at the RV output of delay circuit 601.

NAND logic gate circuit 701 performs a NAND Boolean function on the logic states of the signals at the EN and FW inputs to generate a signal U3. Signal U3 is provided to the input of delay circuit 706. Delay circuit 706 is inverting. Delay circuit 706 delays and inverts signal U3 to generate a signal at the DY output of delay circuit 601. Delay circuit 706 causes the signal at the DY output of delay circuit 601 to be delayed by the coarse delay ΔC and inverted relative to signal U3.

In response to the signal received at the EN input of delay circuit 601 being in a logic high state, NAND logic gate circuit 701 generates signal U3 by inverting the rising and falling edges in the signal received at the FW input of delay circuit 601. Delay circuit 706 generates the signal at the DY output of delay circuit 601 by delaying and inverting the rising and falling edges in signal U3. Because delay circuit 601 has two inversions in its forward path, the signals at the FW input and the DY output of delay circuit 601 have the same polarity.

In response to the signal received at the EN input of delay circuit 601 being in a logic high state, inverter circuit 704 causes signal U1 to be in a logic low state. In response to signal U1 being in a logic low state, NAND logic gate circuit 702 causes its output signal U2 to be in a logic high state. In response to signal U2 being in a logic high state, rising and falling edges received in the signal at the BP input of delay circuit 601 propagate through inverter circuit 705 and NAND logic gate circuit 703 (i.e., the bypass path) to the RV output of delay circuit 601. The signal at the RV output of delay circuit 601 has the same polarity as the signal at the BP input after being inverted twice by circuits 705 and 703. Rising and falling edges in the signal received at the FW input of delay circuit 601 do not propagate through NAND logic gate circuit 702 in response to the signal received at the EN input of delay circuit 601 being in a logic high state.

In response to the signal received at the EN input of delay circuit 601 being in a logic low state, NAND logic gate circuit 701 causes signal U3 to be in a logic high state, and inverter circuit 704 causes signal U1 to be in a logic high state. In response to signal U3 being in a logic high state, delay circuit 706 causes the signal at the DY output of delay circuit 601 to be in a logic low state. In response to signal U1 being in a logic high state, NAND logic gate circuit 702 generates signal U2 by inverting the rising and falling edges in the signal received at the FW input of delay circuit 601. NAND logic gate circuit 703 generates the signal at the RV output of delay circuit 601 by inverting the rising and falling edges in signal U2 if signal U4 is in a logic high state. One or more of the subsequent delay circuits 601 in delay circuit 108 cause the signal at the BP input of the previous delay circuit 601 to be in a logic low state if the signal at the DY output of the previous delay circuit 601 is maintained in a logic low state for long enough to propagate through the one or more subsequent delay circuits 601. Inverter circuit 705 inverts the signal at the BP input of delay circuit 601 to generate signal U4.

In response to the signal received at the EN input of delay circuit 601 being in a logic high state, rising and falling edges in the signal received at the FW input of delay circuit 601 propagate through the forward path to a signal at the DY output of delay circuit 601 after being delayed by coarse delay ΔC. Thus, in response to the signal received at its EN input being in a logic high state, delay circuit 601 generates a signal at its DY output that is a delayed version of the signal received at its FW input. The signal at the DY output of delay circuit 601 is provided to the next delay circuit 601 in the delay line. The next delay circuit 601 in the delay line provides a signal to the BP input of the previous delay circuit 601 that is generated based on the signal received from the DY output of the previous delay circuit 601. In response to the signal received at the EN input of delay circuit 601 being in a logic high state, rising and falling edges in the signal received at the BP input of delay circuit 601 propagate through the bypass path to a signal at the RV output of delay circuit 601 with a negligible delay. Thus, delay circuit 601 generates a signal at its RV output based on the signal received at its BP input in response to the signal received at its EN input being in a logic high state.

In response to the signal received at the EN input of delay circuit 601 being in a logic low state, rising and falling edges in the signal received at the FW input of delay circuit 601 propagate to the RV output of delay circuit 601 through the reverse path with a negligible delay. In response to the signal at its EN input being in a logic low state, delay circuit 601 generates a signal at its RV output based on the signal at its FW input.

In FIG. 7B, delay circuit 602 includes NAND logic gate circuits 701-703, inverter circuits 704-705, and delay circuit 716. The delay of delay circuit 716 is the fine delay ΔF. Each of NAND logic gate circuits 701-703 and inverter circuits 704-705 has a negligible delay relative to the fine delay ΔF of delay circuit 716. NAND logic gate circuits 701-703 and inverter circuits 704-705 function as described above with respect to FIG. 7A. The forward path of delay circuit 602 includes NAND logic gate circuit 701 and delay circuit 716. The reverse path of delay circuit 602 includes NAND logic gate circuits 702-703. The bypass path of delay circuit 602 includes inverter circuit 705 and NAND logic gate circuit 703.

In delay circuit 602, the output signal U3 of NAND logic gate circuit 701 is provided to the input of delay circuit 716. Delay circuit 716 is inverting. Delay circuit 716 delays signal U3 to generate a signal at the DY output of delay circuit 602. Delay circuit 716 causes the signal at the DY output of delay circuit 602 to be delayed by the fine delay ΔF and inverted relative to signal U3.

In response to the signal received at the EN input of delay circuit 602 being in a logic high state, rising and falling edges in the signal received at the FW input of delay circuit 602 propagate to a signal at the DY output of delay circuit 602 through the forward path after being delayed by fine delay ΔF. Thus, in response to the signal received at its EN input being in a logic high state, delay circuit 602 generates a signal at its DY output that is a delayed version of the signal received at its FW input. The signal at the DY output of delay circuit 602 is provided to the next delay circuit 602 in the delay line. The next delay circuit 602 in the delay line provides a signal to the BP input of the previous delay circuit 602 in the delay line that is generated based on the signal received from the DY output of the previous delay circuit 602. In response to the signal received at the EN input of delay circuit 602 being in a logic high state, rising and falling edges in the signal received at the BP input of delay circuit 602 propagate to a signal at the RV output of delay circuit 602 through the bypass path. Thus, delay circuit 602 generates a signal at its RV output based on the signal received at its BP input in response to the signal received at its EN input being in a logic high state.

In response to the signal received at its EN input being in a logic low state, delay circuit 602 generates a signal at its RV output based on the signal at its FW input. In response to the signal received at the EN input of delay circuit 602 being in a logic low state, rising and falling edges in the signal received at the FW input of delay circuit 602 propagate to the RV output of delay circuit 602 through the reverse path with a negligible delay.

Figure 8:
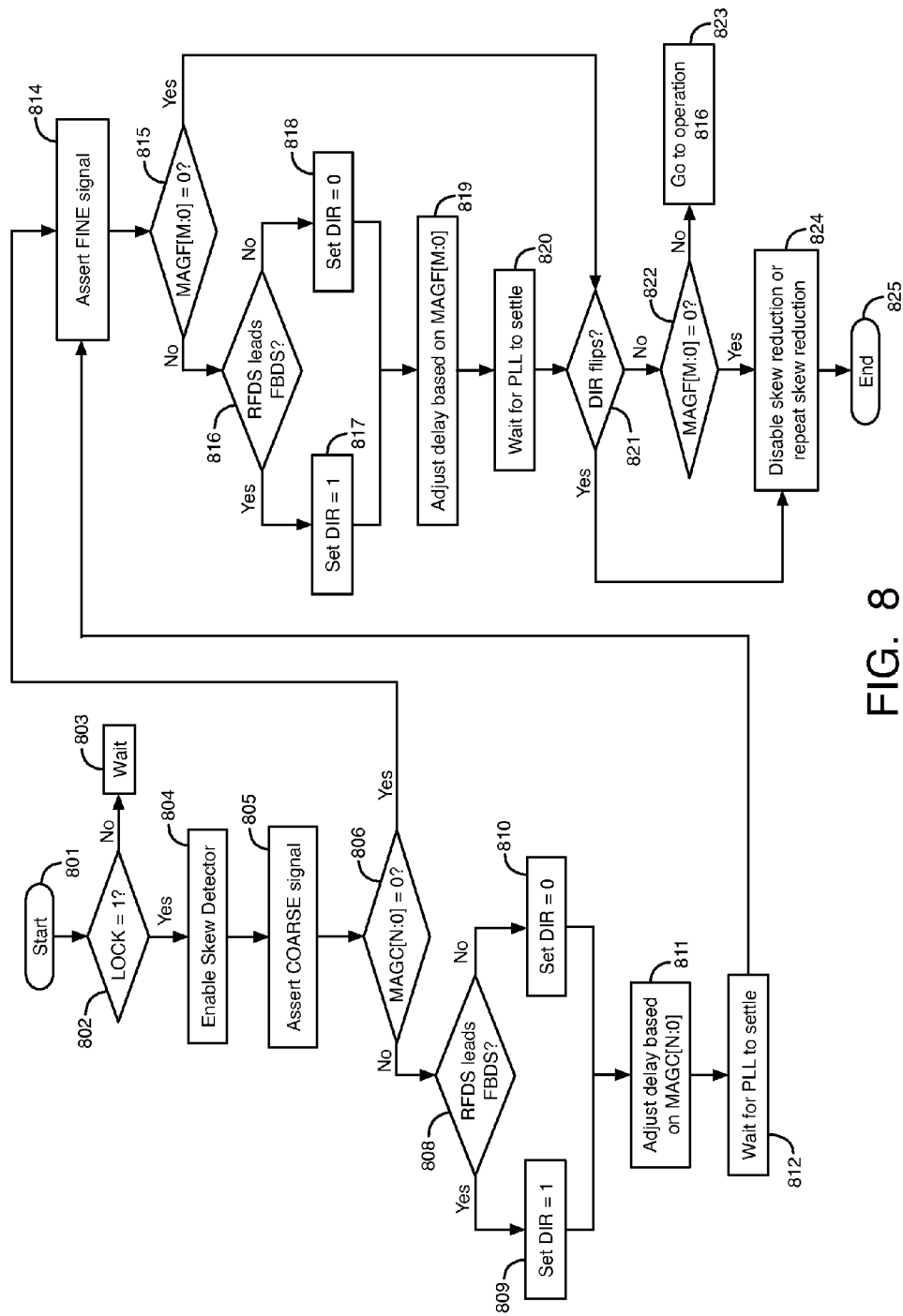
FIG. 8 is a flow chart that shows examples of operations that can be performed by the circuitry shown in FIGS. 1-7B, according to an embodiment of the present invention.

FIG. 8 is a flow chart that shows examples of operations that can be performed by the circuitry shown in FIGS. 1-7B, according to an embodiment of the present invention. The circuitry of FIGS. 1-7B uses the operations of FIG. 8 to reduce skew between the reference and feedback clock signals by adjusting the delays of the delay circuits 108A-108B. Start operation 801 may, for example, be performed in response to the DYCAL signal being asserted. After start operation 801, controller circuit 114 determines if the LOCK signal generated by lock detector circuit 107 is in a logic high state (i.e., 1) in decision operation 802. If the LOCK signal is determined to be in a logic low state in operation 802, controller circuit 114 proceeds to a wait state in operation 803 for a period of time. Controller circuit 114 remains idle in the wait state. After the period of time, controller circuit 114 performs operation 802 again. Controller circuit 114 is clocked by clock signal RFDS in the embodiment of FIG. 1.

If the LOCK signal is determined to be in a logic high state in operation 802, controller circuit 114 proceeds to operation 804. In operation 804, controller circuit 114 enables the skew detector circuit 110. In operation 805, controller circuit 114 asserts the COARSE control signal to a logic high state to begin the coarse skew compensation mode. In response to the COARSE control signal being asserted, coarse skew TDC circuit 112A updates the coarse delay control signals MAGC[N:0] based on clock signals RFDS and FBDS, as described with respect to FIG. 4.

Also, in response to the COARSE control signal being asserted, skew detector circuit 110 performs decision operation 806. If all N+1 of the coarse delay control signals MAGC[N:0] are in logic low states (i.e., MAGC[N:0]=0) in decision operation 806, operation 814 is performed next. Operation 814 is discussed in detail below. If at least one of the coarse delay control signals MAGC[N:0] is in a logic high state (i.e., MAGC[N:0] ≠0) in decision operation 806, then decision operation 808 is performed next.

In decision operation 808, skew detector circuit 110 determines if the phase of clock signal RFDS leads the phase of clock signal FBDS. If the phase of clock signal RFDS leads the phase of clock signal FBDS in operation 808, then lead/lag detector circuit 111 asserts the DIR signal to a logic high state in operation 809. If the phase of clock signal RFDS lags the phase of clock signal FBDS in operation 808, then lead/lag detector circuit 111 clears the DIR signal to a logic low state in operation 810.

In operation 811, one of the delay circuits 108A or 108B adjusts the delay provided to its respective output clock signal RFDS or FBDS based on control signals MAGC[N:0] to reduce or remove the coarse skew between the reference and feedback clock signals. In response to the DIR signal being in a logic high state, delay circuit 108A adjusts the delay provided to clock signal RFDS relative to clock signal RFCK based on control signals MAGC[N:0] to reduce or remove the coarse skew between the reference and feedback clock signals. Delay circuit 108A causes the delay provided to clock signal RFDS relative to clock signal RFCK to equal the coarse delay ΔC times Y (i.e., Y×ΔC) in operation 811. Y is the number of control signals MAGC[N:0] in logic high states. In response to the DIR signal being in a logic high state, delay circuit 108B provides a negligible delay to clock signal FBDS relative to clock signal FBCK.

In response to the DIR signal being in a logic low state, delay circuit 108B adjusts the delay provided to clock signal FBDS relative to clock signal FBCK based on control signals MAGC[N:0] to reduce or remove the coarse skew between the reference and feedback clock signals. Delay circuit 108B causes the delay provided to clock signal FBDS relative to clock signal FBCK to equal the coarse delay ΔC multiplied by Y in operation 811. In response to the DIR signal being in a logic low state, delay circuit 108A provides a negligible delay to clock signal RFDS relative to clock signal RFCK.

After operation 811 is performed, controller circuit 114 waits for the PLL circuit of FIG. 1 to settle in operation 812. Controller circuit 114 determines that the PLL circuit of FIG. 1 has settled in operation 812 when the LOCK signal generated by lock detector circuit 107 is asserted to a logic high state again. After operation 812, operation 814 is performed next.

In operation 814, controller circuit 114 asserts the FINE control signal to a logic high state to begin the fine skew compensation mode. In response to the FINE control signal being asserted, fine skew TDC circuit 112B updates the fine delay control signals MAGF[M:0] based on clock signals RFDS and FBDS as described with respect to FIG. 5. Also, in response to the FINE control signal being asserted, skew detector circuit 110 performs decision operation 815. If all M+1 of the fine delay control signals MAGF[M:0] are in logic low states (i.e., MAGF[M:0]=0) in decision operation 815, operation 821 is performed next. Operation 821 is discussed in detail below.

If at least one of the fine delay control signals MAGF[M:0] is in a logic high state (i.e., MAGF[M:0] ≠0) in decision operation 815, then decision operation 816 is performed next. In decision operation 816, skew detector circuit 110 determines if the phase of clock signal RFDS leads the phase of clock signal FBDS.

If the phase of clock signal RFDS leads the phase of clock signal FBDS in operation 816, then lead/lag detector circuit 111 asserts the DIR signal to a logic high state in operation 817. If the phase of clock signal RFDS lags the phase of clock signal FBDS in operation 816, then lead/lag detector circuit 111 clears the DIR signal to a logic low state in operation 818.

In operation 819, one of the delay circuits 108A or 108B adjusts the delay provided to its respective output clock signal RFDS or FBDS based on control signals MAGF[M:0] to reduce or remove the fine skew between the reference and feedback clock signals. In response to the DIR signal being in a logic high state, delay circuit 108A adjusts the delay provided to clock signal RFDS relative to clock signal RFCK based on control signals MAGF[M:0] to reduce or remove the fine skew between the reference and feedback clock signals. Delay circuit 108A causes the delay provided to clock signal RFDS relative to clock signal RFCK to equal (Y×ΔC)+(Z×ΔF) in operation 819. Z equals the number of control signals MAGF[M:0] that are in logic high states. In response to the DIR signal being in a logic high state, delay circuit 108B provides a negligible delay to clock signal FBDS relative to clock signal FBCK.

In response to the DIR signal being in a logic low state, delay circuit 108B adjusts the delay provided to clock signal FBDS relative to clock signal FBCK based on control signals MAGF[M:0] to reduce or remove the fine skew between the reference and feedback clock signals. Delay circuit 108B causes the delay provided to clock signal FBDS relative to clock signal FBCK to equal (Y×ΔC)+(Z×ΔF) in operation 819. In response to the DIR signal being in a logic low state, delay circuit 108A provides a negligible delay to clock signal RFDS relative to clock signal RFCK.

Skew detector circuit 110 causes delay circuits 108A-108B to compensate for the coarse and fine skews between the reference and feedback clock signals based on control signals MAGC[N:0], MAGF[M:0], and DIR. Skew detector circuit 110 adjusts at least one of the output clock signals RFDS and FBDS of delay circuits 108A and 108B, respectively, to compensate for the coarse and fine skews between clock signals RFCK and FBCK. Skew detector circuit 110 causes the output clock signals RFDS and FBDS of delay circuits 108A and 108B, respectively, to be more closely aligned in phase when the PLL of FIG. 1 is in lock.

After operation 819 is performed, controller circuit 114 waits for the PLL circuit of FIG. 1 to settle in operation 820. Controller circuit 114 determines that the PLL circuit of FIG. 1 has settled in operation 820 when the LOCK signal is asserted to a logic high state again. After controller circuit 114 has determined that the PLL circuit of FIG. 1 has settled in operation 820, controller circuit 114 performs operation 821. In operation 821, controller circuit 114 determines if the DIR signal has flipped its logic state since operation 814. If the DIR signal has not flipped its logic state since operation 814, and if the fine delay control signals MAGF [M:0] ≠0 in decision operation 822, skew detector circuit 110 returns to operation 816 again as shown in box 823. A second iteration of operations 816-821 is then performed.

If controller circuit 114 determines in operation 821 that the DIR signal has flipped its logic state since operation 814, operation 824 is performed next. If all of the fine delay control signals MAGF[M:0]=0 in decision operation 822, another iteration of operations 816-821 is not performed, and operation 824 is performed next. In operation 824, the skew reduction procedure of FIG. 8 is disabled or repeated. As an example, the skew reduction procedure of FIG. 8 may be disabled by de-asserting the DYCAL signal. If the DYCAL signal continues to be asserted in operation 824, the skew reduction procedure of FIG. 8 is repeated. The skew reduction procedure of FIG. 8 may be repeated once or multiple times for continuous calibration of the skew between the reference and feedback clock signals. The skew reduction procedure of FIG. 8 ends in operation 825.

In an embodiment, the SEL signal is set to a first logic state to cause multiplexer circuit 106 to generate clock signal FBCK based on clock signal CKNET. The skew reduction circuit of FIG. 1 then reduces or removes skew between clock signals RFDS and FBDS using the skew reduction procedure of FIG. 8 based on a feedback clock signal FBCK that is delayed by clock network 105. Subsequently, the SEL signal is set to a second logic state to cause multiplexer circuit 106 to generate clock signal FBCK based on clock signal CKDIV. The skew reduction circuit of FIG. 1 then reduces or removes skew between clock signals RFDS and FBDS using the skew reduction procedure of FIG. 8 based on a feedback clock signal FBCK that bypasses clock network 105. In this embodiment, the skew reduction circuit of FIG. 1 generates delays for delay circuits 108A-108B for each configurable state of multiplexer circuit 106.

Figure 9:
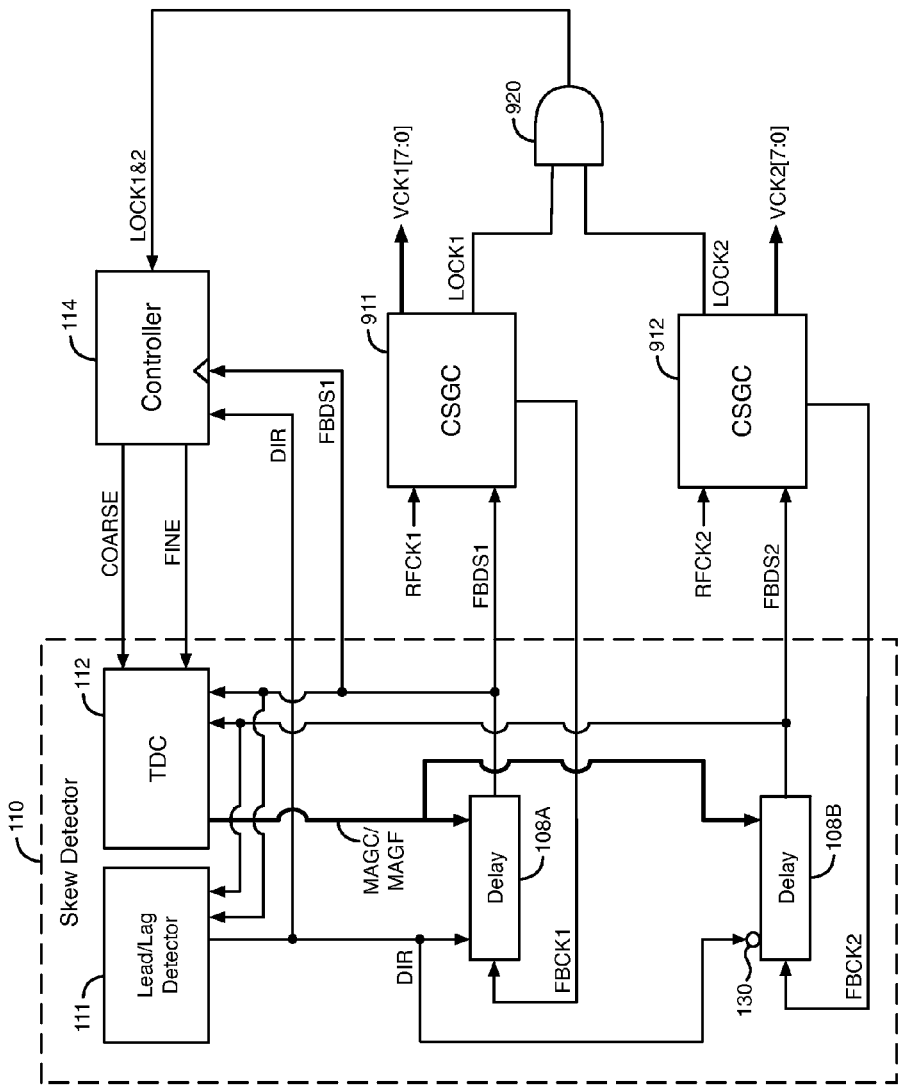
FIG. 9 illustrates an example of a skew reduction circuit that reduces skew between feedback clock signals generated by two different clock signal generation circuits, according to an embodiment of the present invention.

FIG. 9 illustrates an example of a skew reduction circuit that reduces skew between feedback clock signals generated by two different clock signal generation circuits, according to an embodiment of the present invention. The circuitry of FIG. 9 includes skew detector circuit 110, controller circuit 114, a first clock signal generation circuit (CSGC) 911, a second clock signal generation circuit (CSGC) 912, and an AND logic gate circuit 920. Skew detector circuit 110 includes lead/lag detector circuit 111, TDC circuit 112, delay circuits 108A-108B, and inverter circuit 130. Skew detector circuit 110 (as well as its subcomponents) and controller circuit 114 function as described above with respect to FIGS. 1-8. CSGCs 911-912 may be, for example, two phase-locked loop (PLL) circuits, two delay-locked loop (DLL) circuits, or one PLL circuit and one DLL circuit.

In the embodiment of FIG. 9, reference clock signals RFCK1 and RFCK2 are provided to inputs of CSGCs 911-912, respectively. CSGC 911 generates 8 output clock signals VCK1[7:0]. CSGC 912 generates 8 output clock signals VCK2[7:0]. CSGCs 911-912 generate feedback clock signals FBCK1 and FBCK2, respectively. Feedback clock signals FBCK1 and FBCK2 are provided to inputs of delay circuits 108A-108B, respectively. Delay circuits 108A-108B generate feedback clock signals FBDS1 and FBDS2 based on feedback clock signals FBCK1 and FBCK2, respectively, in the embodiment of FIG. 9. Feedback clock signals FBDS1 and FBDS2 are provided to inputs of CSGCs 911-912, respectively.

CSGCs 911-912 generate lock signals LOCK1 and LOCK2, respectively. Lock signals LOCK1 and LOCK2 are provided to inputs of AND logic gate circuit 920. AND logic gate 920 performs an AND Boolean logic function on the logic states of lock signals LOCK1 and LOCK2 to generate lock signal LOCK1&2. Lock signal LOCK1&2 is provided to an input of controller circuit 114. Lock signal LOCK1&2 is in a logic high state when both of CSGCs 911-912 are in lock. Lock signal LOCK1&2 is in a logic low state when one or both of CSGCs 911-912 are not in lock. In the embodiment of FIG. 9, controller circuit 114 performs operations 802, 812, and 820 shown in FIG. 8 in response to signal LOCK1&2, instead of signal LOCK.

CSGC 911 varies the phases and/or frequencies of output clock signals VCK1 [7:0] and feedback clock signal FBCK1 in response to changes in the difference between the phases and/or frequencies of clock signals RFCK1 and FBDS1. CSGC 912 varies the phases and/or frequencies of output clock signals VCK2[7:0] and feedback clock signal FBCK2 in response to changes in the difference between the phases and/or frequencies of clock signals RFCK2 and FBDS2. Each of CSGCs 911 and 912 may, for example, be a PLL circuit that has the circuitry 101-107 and 121-123 shown for the PLL circuit of FIG. 1.

In the embodiment of FIG. 9, skew detector circuit 110 reduces skew between feedback clock signals FBDS1 and FBDS2. Skew detector circuit 110 provides a multiple of the coarse delay $\Delta C$ and/or a multiple of the fine delay $\Delta F$ to one of feedback clock signals FBDS1 or FBDS2 to compensate for the coarse and fine skews between feedback clock signals FBCK1 and FBCK2, as described above with respect to clock signals RFDS and FBDS.

Figure 10:
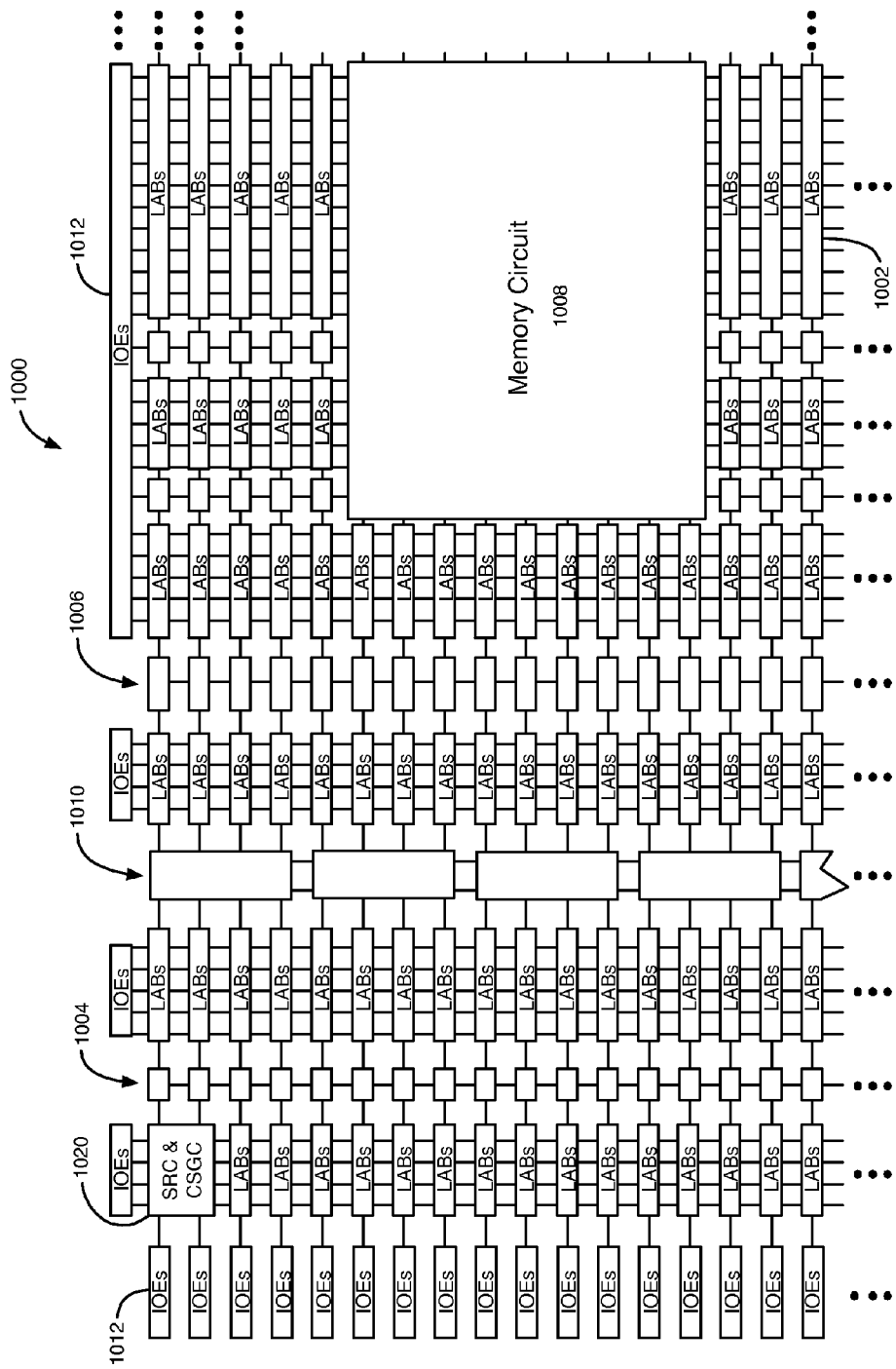
FIG. 10 is a simplified partial block diagram of a field programmable gate array (FPGA) that can include aspects of the present invention.

FIG. 10 is a simplified partial block diagram of a field programmable gate array (FPGA) 1000 that can include aspects of the present invention. FPGA 1000 is merely one example of an integrated circuit that can include features of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), application specific integrated circuits (ASICs), memory integrated circuits, central processing units, microprocessors, analog integrated circuits, etc.

FPGA 1000 includes a two-dimensional array of programmable logic array blocks (or LABs) 1002 that are interconnected by a network of column and row interconnect conductors of varying length and speed. LABs 1002 include several logic elements (or LEs).

A logic element (LE) is a programmable logic circuit block that provides for efficient implementation of user defined logic functions. An FPGA has numerous logic elements that can be configured to implement various combinatorial and sequential functions. The logic elements have access to a programmable interconnect structure of interconnect conductors. The programmable interconnect structure can be programmed to interconnect the logic elements in almost any desired configuration.

FPGA 1000 may also include a distributed memory structure including random access memory (RAM) circuits of varying sizes provided throughout the array. The RAM circuits include, for example, circuits 1004, circuits 1006, and circuit 1008. These memory circuits can also include shift registers and first-in first-out (FIFO) circuits.

FPGA 1000 may further include digital signal processing (DSP) circuits 1010 that can implement, for example, multipliers with add or subtract features. Input/output elements (IOEs) 1012 support numerous single-ended and differential input/output standards. IOEs 1012 may also include receiver circuits and transmitter circuits. The transmitter and receiver circuits are coupled to pads of the integrated circuit. The pads are external terminals of the FPGA die that can be used to route, for example, input signals, output signals, and supply voltages between the FPGA and one or more external devices. FPGA 1000 may include one or more circuits 1020.

Circuit 1020 includes a skew reduction circuit (SRC) and one or more clock signal generation circuits (CSGC) as shown and described herein with respect to FIGS. 1 and 9. FPGA 1000 is described herein for illustrative purposes. Embodiments of the present invention can be implemented in many different types of integrated circuits.

Figure 11:
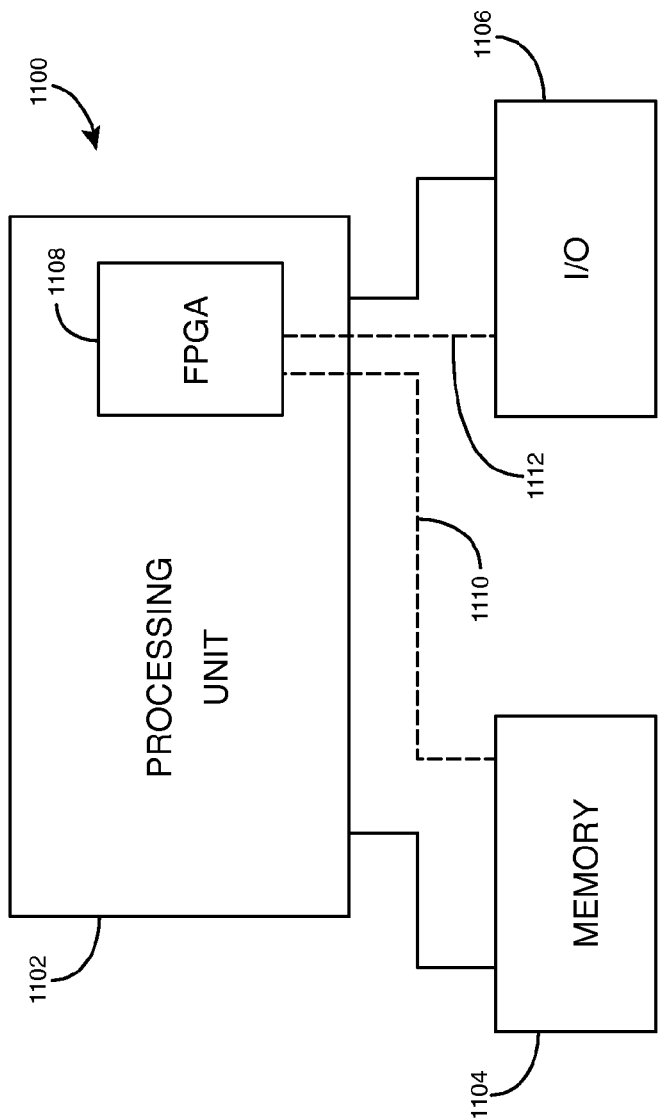
FIG. 11 shows a block diagram of an exemplary digital system that can embody techniques of the present invention.

The present invention can also be implemented in a system that has an FPGA as one of several components. FIG. 11 shows a block diagram of an exemplary digital system 1100 that can embody techniques of the present invention. System 1100 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 1100 can be provided on a single board, on multiple boards, or within multiple enclosures.

System 1100 includes a processing unit 1102, a memory unit 1104, and an input/output (I/O) unit 1106 interconnected together by one or more buses. According to this exemplary embodiment, an FPGA 1108 is embedded in processing unit 1102. FPGA 1108 can serve many different purposes within the system of FIG. 11. FPGA 1108 can, for example, be a logical building block of processing unit 1102, supporting its internal and external operations. FPGA 1108 is programmed to implement the logical functions necessary to carry on its particular role in system operation. FPGA 1108 can be specially coupled to memory 1104 through connection 1110 and to I/O unit 1106 through connection 1112.

Processing unit 1102 can direct data to an appropriate system component for processing or storage, execute a program stored in memory 1104, receive and transmit data via I/O unit 1106, or other similar functions. Processing unit 1102 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 1108 can control the logical operations of the system. As another example, FPGA 1108 acts as a reconfigurable processor that can be reprogrammed as needed to handle a particular computing task. Alternatively, FPGA 1108 can itself include an embedded microprocessor. Memory unit 1104 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A circuit comprising:
   a clock signal generation circuit to generate a first clock signal based on second and third clock signals, wherein the clock signal generation circuit generates an indication of a phase difference between the second and the third clock signals; and
   a skew reduction circuit to reduce skew between the second and the third clock signals in response to the indication of the phase difference between the second and the third clock signals indicating that the second and the third clock signals are aligned in phase within at least an error margin of the clock signal generation circuit.

2. The circuit of claim 1, wherein the skew reduction circuit comprises a time-to-digital converter circuit to measure the skew between the second and the third clock signals.

3. The circuit of claim 2, wherein the time-to-digital converter circuit comprises:
   a coarse skew time-to-digital converter circuit to measure a coarse skew between the second and the third clock signals; and
   a fine skew time-to-digital converter circuit to measure a fine skew between the second and the third clock signals.

4. The circuit of claim 1, wherein the skew reduction circuit comprises a detector circuit to generate a directional signal indicating whether a phase of the second clock signal is leading or lagging a phase of the third clock signal.

5. The circuit of claim 4, wherein the skew reduction circuit further comprises:
   a first delay line to provide a coarse delay to the second clock signal in response to a coarse skew measured between the second and the third clock signals if the directional signal indicates that the phase of the second clock signal is leading the phase of the third clock signal; and
   a second delay line to provide a fine delay to the second clock signal in response to a fine skew measured between the second and the third clock signals if the directional signal indicates that the phase of the second clock signal is leading the phase of the third clock signal, wherein the coarse delay is larger than the fine delay.

6. The circuit of claim 5, wherein the skew reduction circuit further comprises:
   a third delay line to provide the coarse delay to the third clock signal in response to the coarse skew measured between the second and the third clock signals if the directional signal indicates that the phase of the third clock signal is leading the phase of the second clock signal; and
   a fourth delay line to provide the fine delay to the third clock signal in response to the fine skew measured between the second and the third clock signals if the directional signal indicates that the phase of the third clock signal is leading the phase of the second clock signal.

7. The circuit of claim 1, wherein the skew reduction circuit comprises a first delay circuit to generate the second clock signal based on the first clock signal and a second delay circuit to generate the third clock signal based on a fourth clock signal, wherein the skew reduction circuit generates a measurement of the skew between the second and the third clock signals, and wherein the skew reduction circuit adjusts a delay of at least one of the first and the second delay circuits to reduce the skew between the second and the third clock signals based on the measurement of the skew.

8. The circuit of claim 1, wherein the clock signal generation circuit comprises a detector circuit to generate a phase error signal that indicates the phase difference between the second and the third clock signals, wherein the skew reduction circuit reduces the skew between the second and the third clock signals in response to the phase error signal, and wherein the clock signal generation circuit comprises at least one of a phase-locked loop circuit or a delay-locked loop circuit.

9. The circuit of claim 1, wherein the clock signal generation circuit comprises a lock detector circuit that generates a lock signal to indicate when the second and the third clock signals are aligned in phase within a static phase offset, and wherein the skew reduction circuit reduces the skew between the second and the third clock signals in response to the lock signal.

10. A circuit comprising:
   a clock signal generation circuit to generate a first clock signal based on second and third clock signals, wherein the clock signal generation circuit generates an indication of a phase difference between the second and the third clock signals; and
   a skew reduction circuit to generate an indication of a skew between the second and the third clock signals in response to the indication of the phase difference between the second and the third clock signals indicating that the second and the third clock signals are aligned in phase within at least an error margin, wherein the skew reduction circuit reduces the skew between the second and the third clock signals based on the indication of the skew between the second and the third clock signals.

11. The circuit of claim 10, wherein the skew reduction circuit generates the second clock signal based on the first clock signal.

12. The circuit of claim 10, wherein the skew reduction circuit comprises:
   a coarse skew time-to-digital converter circuit to measure a coarse skew between the second and the third clock signals; and
   a fine skew time-to-digital converter circuit to measure a fine skew between the second and the third clock signals, wherein the skew reduction circuit reduces the coarse skew and the fine skew measured between the second and the third clock signals.

13. The circuit of claim 10, wherein the skew reduction circuit comprises a detector circuit to generate a directional signal indicating whether a phase of the second clock signal is leading or lagging a phase of the third clock signal, and wherein the skew reduction circuit determines whether to adjust a delay provided to the second clock signal or to adjust a delay provided to the third clock signal to reduce the skew based on the directional signal.

14. The circuit of claim 10, wherein the skew reduction circuit comprises:
   first delay circuits coupled in a first delay line to provide a coarse delay to the second clock signal in response to an indication of a coarse skew between the second and the third clock signals if the second clock signal is leading the third clock signal; and
   second delay circuits coupled in a second delay line to provide a fine delay to the second clock signal in response to an indication of a fine skew between the second and the third clock signals if the second clock signal is leading the third clock signal, wherein the coarse delay is larger than the fine delay.

15. The circuit of claim 14, wherein the skew reduction circuit further comprises:
   third delay circuits coupled in a third delay line to provide the coarse delay to the third clock signal in response to the indication of the coarse skew between the second and the third clock signals if the third clock signal is leading the second clock signal; and
   fourth delay circuits coupled in a fourth delay line to provide the fine delay to the third clock signal in response to the indication of the fine skew between the second and the third clock signals if the third clock signal is leading the second clock signal.

16. The circuit of claim 10, wherein the skew reduction circuit comprises a controller circuit to control a measurement of a coarse skew between the second and the third clock signals and to control a measurement of a fine skew between the second and the third clock signals, and wherein the skew reduction circuit removes the coarse and the fine skews measured between the second and the third clock signals.

17. A method comprising:
   generating a first clock signal based on second and third clock signals using a clock signal generation circuit;
   generating an indication of a phase difference between the second and the third clock signals using the clock signal generation circuit;
   generating an indication of a skew between the second and the third clock signals in response to the indication of the phase difference between the second and the third clock signals indicating that the second and the third clock signals are aligned in phase within at least an error margin using a skew reduction circuit; and
   reducing the skew between the second and the third clock signals based on the indication of the skew between the second and the third clock signals using the skew reduction circuit.

18. The method of claim 17, wherein generating an indication of a skew between the second and the third clock signals comprises measuring the skew between the second and the third clock signals using a time-to-digital converter circuit.

19. The method of claim 17, wherein reducing the skew between the second and the third clock signals comprises:
   generating the second clock signal based on the first clock signal using a first delay circuit;
   generating the third clock signal based on a fourth clock signal using a second delay circuit; and
   adjusting a delay of at least one of the first and the second delay circuits to reduce the skew between the second and the third clock signals based on the indication of the skew between the second and the third clock signals.

20. The method of claim 17, wherein generating an indication of a skew between the second and the third clock signals comprises:
   generating a directional signal using a storage circuit that indicates whether a phase of the second clock signal is leading or lagging a phase of the third clock signal; and
   adjusting a delay provided to one of the second clock signal or the third clock signal to reduce the skew between the second and the third clock signals based on the directional signal using the skew reduction circuit.

* * * * *